(12) United States Patent
Pyeon

(10) Patent No.: US 8,194,481 B2
(45) Date of Patent: Jun. 5, 2012

(54) SEMICONDUCTOR DEVICE WITH MAIN MEMORY UNIT AND AUXILIARY MEMORY UNIT REQUIRING PRESET OPERATION

(75) Inventor: Hong-Beom Pyeon, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 237 days.

(21) Appl. No.: 12/640,388

(22) Filed: Dec. 17, 2009

(65) Prior Publication Data
US 2010/0157715 A1    Jun. 24, 2010

Related U.S. Application Data

(63) Continuation-in-part of application No. 12/337,841, filed on Dec. 18, 2008, now Pat. No. 8,037,235, and a continuation-in-part of application No. 12/564,492, filed on Sep. 22, 2009.

(60) Provisional application No. 61/213,990, filed on Aug. 5, 2009.

(51) Int. Cl.
*G11C 7/00* (2006.01)
*G11C 8/00* (2006.01)

(52) U.S. Cl. ............... 365/200; 365/230.03; 365/230.05; 365/230.06

(58) Field of Classification Search ................... 365/154, 365/156, 200, 230.03, 230.05, 230.06
See application file for complete search history.

(56) References Cited

U.S. PATENT DOCUMENTS

| | | | |
|---|---|---|---|
| 4,617,566 A | 10/1986 | Diamond | |
| 4,639,895 A * | 1/1987 | Iwahashi et al. | ............... 365/200 |
| 4,796,231 A | 1/1989 | Pinkham | |
| 4,802,129 A | 1/1989 | Hoekstra et al. | |
| 5,132,635 A | 7/1992 | Kennedy | |
| 5,204,669 A | 4/1993 | Dorfe et al. | |
| 5,243,703 A | 9/1993 | Farmwald et al. | |
| 5,265,048 A * | 11/1993 | Kimura | ................... 365/230.03 |
| 5,319,598 A | 6/1994 | Aralis et al. | |
| 5,402,377 A * | 3/1995 | Ohhata et al. | ................. 365/200 |
| 5,404,460 A | 4/1995 | Thomsen et al. | |

(Continued)

FOREIGN PATENT DOCUMENTS
WO    2005/069150 A1    7/2005

(Continued)

OTHER PUBLICATIONS

Shinji Saito et al., "A Programmable 80ns 1Mb CMOS EPROM", IEEE ISSCC 85, Digest of Technical Papers, Feb. 14, 1985, pp. 176-177, 340.

(Continued)

*Primary Examiner* — Trong Phan

(57) ABSTRACT

A semiconductor device that can implement a method comprising selecting a group of rows of auxiliary cells forming part of an auxiliary memory unit, the auxiliary cells being arranged into rows and columns; driving a plurality of bitlines each connected to a respective column of the auxiliary cells, so as to set each of the auxiliary cells to a first logic state; writing input data to selected ones of a plurality of main cells, wherein each of the auxiliary cells corresponds to a respective set of the main cells; selecting a particular row of auxiliary cells that includes at least one auxiliary cell whose corresponding main cells are among the selected cells; and driving the bitlines so as to set the at least one auxiliary cell to a second logic state different from the first logic state.

47 Claims, 8 Drawing Sheets

U.S. PATENT DOCUMENTS

| | | | |
|---|---|---|---|
| 5,430,859 A | 7/1995 | Norman et al. | |
| 5,437,018 A | 7/1995 | Kobayashi et al. | |
| 5,473,563 A | 12/1995 | Suh et al. | |
| 5,473,566 A | 12/1995 | Rao | |
| 5,473,577 A | 12/1995 | Miyake et al. | |
| 5,535,357 A | 7/1996 | Moran et al. | |
| 5,636,342 A | 6/1997 | Jeffries | |
| 5,721,840 A | 2/1998 | Soga | |
| 5,729,683 A | 3/1998 | Le et al. | |
| 5,740,379 A | 4/1998 | Hartwig | |
| 5,802,399 A | 9/1998 | Yumoto et al. | |
| 5,802,555 A | 9/1998 | Shigeeda | |
| 5,806,070 A | 9/1998 | Norman et al. | |
| 5,828,899 A | 10/1998 | Richard et al. | |
| 5,859,809 A | 1/1999 | Kim | |
| 5,914,907 A * | 6/1999 | Kobayashi et al. | 365/230.03 |
| 5,953,538 A | 9/1999 | Duncan et al. | |
| 5,959,930 A | 9/1999 | Sakurai | |
| 6,002,638 A | 12/1999 | John | |
| 6,091,660 A | 7/2000 | Sasaki et al. | |
| 6,101,579 A | 8/2000 | Randolph et al. | |
| 6,144,576 A | 11/2000 | Leddige et al. | |
| 6,148,363 A | 11/2000 | Lofgren et al. | |
| 6,208,556 B1 | 3/2001 | Akaogi et al. | |
| 6,230,233 B1 | 5/2001 | Lofgren et al. | |
| 6,295,618 B1 | 9/2001 | Keeth | |
| 6,304,921 B1 | 10/2001 | Rooke | |
| 6,317,350 B1 | 11/2001 | Pereira et al. | |
| 6,317,352 B1 | 11/2001 | Halbert et al. | |
| 6,317,812 B1 | 11/2001 | Lofgren et al. | |
| 6,335,873 B1 * | 1/2002 | Kawaguchi et al. | 365/230.03 |
| 6,438,064 B2 | 8/2002 | Ooishi | |
| 6,442,098 B1 | 8/2002 | Kengeri | |
| 6,453,365 B1 | 9/2002 | Habot | |
| 6,456,528 B1 | 9/2002 | Chen | |
| 6,535,218 B1 | 3/2003 | Schlapp | |
| 6,559,851 B1 | 5/2003 | Schlapp | |
| 6,594,183 B1 | 7/2003 | Lofgren et al. | |
| 6,594,818 B2 * | 7/2003 | Kim et al. | 365/200 |
| 6,601,199 B1 | 7/2003 | Fukuda et al. | |
| 6,658,509 B1 | 12/2003 | Bonella et al. | |
| 6,680,904 B1 | 1/2004 | Kaplan et al. | |
| 6,683,817 B2 | 1/2004 | Wei et al. | |
| 6,715,044 B2 | 3/2004 | Lofgren et al. | |
| 6,717,847 B2 | 4/2004 | Chen | |
| 6,754,807 B1 | 6/2004 | Parthasarathy et al. | |
| 6,763,426 B1 | 7/2004 | James et al. | |
| 6,807,106 B2 | 10/2004 | Gonzales et al. | |
| 6,816,933 B1 | 11/2004 | Andreas | |
| 6,850,443 B2 | 2/2005 | Lofgren et al. | |
| 6,853,557 B1 | 2/2005 | Haba et al. | |
| 6,853,573 B2 | 2/2005 | Kim et al. | |
| 6,928,501 B2 | 8/2005 | Andreas et al. | |
| 6,944,093 B2 | 9/2005 | Sumitani | |
| 6,944,697 B2 | 9/2005 | Andreas | |
| 6,950,325 B1 | 9/2005 | Chen | |
| 6,978,402 B2 | 12/2005 | Hirabayashi | |
| 6,996,644 B2 | 2/2006 | Schoch et al. | |
| 7,031,221 B2 | 4/2006 | Mooney et al. | |
| 7,054,217 B2 * | 5/2006 | Yamada | 365/230.05 |
| 7,181,572 B2 | 2/2007 | Walmsley | |
| 7,336,516 B2 | 2/2008 | Tran et al. | |
| 7,370,170 B2 | 5/2008 | Shaikh et al. | |
| 7,505,295 B1 | 3/2009 | Nataraj et al. | |
| 7,505,319 B2 * | 3/2009 | Wu et al. | 365/200 |
| 7,533,222 B2 | 5/2009 | Leung | |
| 7,599,975 B1 | 10/2009 | Donovan et al. | |
| 7,742,334 B2 | 6/2010 | Fujisawa et al. | |
| 2002/0161941 A1 | 10/2002 | Chue et al. | |
| 2008/0209110 A1 | 8/2008 | Pyeon et al. | |
| 2008/0279003 A1 | 11/2008 | Kim et al. | |
| 2010/0161877 A1 | 6/2010 | Pyeon | |
| 2011/0032784 A1 | 2/2011 | Pyeon | |

FOREIGN PATENT DOCUMENTS

| | | |
|---|---|---|
| WO | 2008/022434 A1 | 2/2008 |

OTHER PUBLICATIONS

R. Kirisawa et al., "A NAND Structured Cell with a new Programming Technology for Highly Reliable 5V-Only Flash EEPROM", 1990 Symposium on VLSI Tech., Apr. 6, 1990, pp. 129-130.

S. Aritome et al., "A Reliable Bi-Polarity Write/Erase Technology in Flash EEPROMs", Int'l Electron Devices Meeting, 1990, Technical Digest, Dec. 9-12, 1990, pp. 111-114.

R. Shirota et al., "A 2.3μm2 Memory Cell Structure for 16Mb NAND EEPROMs", International Electron Devices Meeting 1990, Technical Digest, (1990), pp. 103-106.

Samsung Electronics Co. Ltd, "256M × 8 Bit / 128M × 16 Bit / 512M × 8 Bit NAND Flash Memory", K9K4G08U1M, K9F2G08U0M, K9F2G16U0M, May 6, 2005, pp. 1-41.

Samsung Electronics Co. Ltd., "1G × 8 Bit/ 2G × 8 Bit NAND Flash Memory", K9F8G08UXM, May 31, 2007, pp. 1-54.

Samsung Electronics Co. Ltd., "512M × 8 Bit / 1G × 8 Bit NAND Flash Memory", K9XXG08UXA, May 7, 2006, pp. 1-43.

Samsung Electronics Co. Ltd, "1G × 8 Bit / 2 G × 8 Bit / 4G × 8 Bit NAND Flash Memory", K9XXG08UXA, Jul. 18, 2006, pp. 1-50.

Eran Gal et al., "Algorithms and Data Structures for Flash Memories", ACM Computing Surveys (CSUR), vol. 37, No. 2, Jun. 2005, Tel Aviv University, pp. 138-163.

Samsung Electronics Co. Ltd, "2G × 8 Bit NAND Flash Memory", K9GAG08U0M, Apr. 12, 2006, pp. 1-48.

Toshiba, "16 Gbit (2G × 8 Bit) CMOS NAND E2PROM (Multi-Level-Cell)", TC58NVG4D1DTG00, Nov. 9, 2006, pp. 1-64.

Atmel Corp., "High Speed Small Sectored SPI Flash Memory 4M (524,288 × 8)", AT25FS040 Advance Information, pp. 1-22, 2006.

Stephen L. Diamond, "SyncLink: High-speed DRAM for the future", Micro Standards, IEEE Micro, Dec. 1996, pp. 74-75.

Atmel, "8-megabit 2.5-volt Only or 2.7-volt Only DataFlash® ", AT45DB081B, Technical Specification, Atmel, Rev. 2225H-DFLSH (2004), pp. 1-32.

Intel Corporation, "Intel® Advanced+ Boot Block Flash Memory (C3)", May 2005, pp. 1-72.

Joseph Kennedy et al, "A 2Gb/s Point-to-Point Heterogeneous Voltage Capable DRAM Interface for Capacity-Scalable . . . ", ISSCC 2004/Session 11/DRAM111.8, Feb. 15-19, 2004, 10 pages.

Craig L. King et al., "Communicating with Daisy Chained MCP42XXX Digital Potentiometers", Microchip AN747, 2001, pp. 1-8.

M-Systems Flash Disk Pioneers Ltd., "DiskOnChip H1 4Gb (512MByte) and 8Gb (1GByte) High Capacity Flash Disk with NAND and x2 Technology", Data Sheet, Rev. 0.5, pp. 1-66.

Dae-Seok Byeon et al., "An 8Gb Multi-Level NAND Flash Memory with 63nm STI CMOS Process Technology", ISSCC 2005/Session 2/Non-Volatile Memory/2.2, pp. 46-47.

Taehee Cho et al., "A Dual Mode NAND Flash Memory: 1-Gb Multilevel and High-Performance 512-Mb . . . ", IEEE Jrnl of Solid-State Circuits, vol. 36, No. 11, Nov. 2001, pp. 1700-1706.

Young Choi, "16-Gbit MLC NAND flash weighs in", EETimes.com, Jul. 7, 2007, http://www.eetimes.com/showArticle.jhtml?articleD=201200825, pp. 1-3.

Takahiko Hara et al., "A 146mm2 8GB NAND Flash Memory with 70nm CMOS Technology", ISSCC 2005/Session 2/Non-Volatile Memory/2.1, Feb. 2005, pp. 44, 45, 584.

Kenichi Imamiya et al., "A 125-mm2 1-Gb NAND Flash Memory with 10-MByte/s Program Speed", IEEE Journal of Solid-State Circuits, vol. 37, No 11, Nov. 2002, pp. 1493-1501.

Tae-Sung Jung et al., "A 117-mm2 3.3-V Only 128-Mb Multilevel NAND Flash Memory for Mass Storage Appls.," IEEE J. of Solid-State Circuits, vol. 31,No. 11, Nov. 1996, pp. 1575-1583.

Jin-Ki Kim et al. "A-120-mm2 64 Mb NAND Flash Memory Archieving 180 ns/Byte Effective Program Speed," IEEE J. Of Solid-State Circuits, vol. 32, No. 5, May 1997, pp. 670-680.

June Lee et al., "A 90-nm CMOS 1.8-V 2-Gb NAND Flash Memory for Mass Storage Appls.", IEEE Journal of Solid-State Circuits, vol. 38, No. 11, Nov. 2003. pp. 1934-1942.

June Lee et al., "High-Performance 1-Gb NAND Flash Memory with 0.12-μ-m Technology", IEEE Journal of Solid-State Circuits, vol. 37, No. 11, Nov. 2002, pp. 1502-1509.

Masaki Momodomi et al., "A 4-Mb NAND EEPROM with Tight Programmed Vt Distribution", IEEE Journal of Solid-State Circuits, vol. 26, No. 4, Apr. 1991, pp. 492-496.

Nobuaki Ohtsuka et al., "A 4-Mbit CMOS EPROM", IEEE Journal of Solid-State Circuits, vol. SC-22, No. 5, Oct. 1987, pp. 669-675.

Kang-Deog Suh et al., "A 3.3 V 32 Mb NAND Flash Memory with Incremental Step Pulse Programming Scheme", IEEE J. of Solid-State Circuits, vol. 30, No. 11, Nov. 1995, pp. 1149-1156.

Ken Takeuchi et al, "A 56nm CMOS 99mm2 8Gb Multi-level NAND Flash Memory with 10MB/s Program Troughput", ISSCC 2006/ Session 7/Non-Volatile Memory/7.7, Feb. 6-9, 2006, pp. 144,145,645.

Ken Takeuchi et al, "A Multipage Cell Architecture for High-Speed Programming Multilevel NAND Flash . . . ", IEEE J. of Solid-State Circuits, vol. 33, No. 8, Aug. 1998, pp. 1228-1238.

T. Tanaka et al., "A Quick Intelligent Page-Programming Architecture and a Shielded Bitline Sensing . . . " IEEE J. of Solid-State Circuits, vol. 29, No. 11, Nov. 1994, pp. 1366-1373.

Toru Tanzawa et al., "A Dynamic Analysis of the Dickson Charge Pump Circuit", IEEE J. of Solid-State Circuits, vol. 32, No. 8, Aug. 1997, pp. 1231-1240.

Toru Tanzawa et al., "Circuit Techniques for a 1.8-V-Only NAND Flash Memory", IEEE Journal of Solid-State Circuits, vol. 37, No. 1, Jan. 2002, pp. 84-89.

Naoto Tomita et al., "A 62-ns 16Mb CMOS EPROM with Voltage Stress Relaxation Technique", IEEE Journal of Solid-State Circuits, vol. 26, No. 11, Nov. 1991, pp. 1593-1599.

Toshiba, "2GBIT (256M x 8 Bits) CMOS NAND E2PROM", TH58NVG1S3AFT05, May 19, 2003, pp. 1-32.

Yoichi Oshima et al., "High-Speed Memory Architectures for Multimedia Applictions", Circuits & Devices, IEEE 8755-3996/97, pp. 8-13, Jan. 1997.

Samsung Electronics, "K9XXG08UXM Preliminary Flash Memory", Technical Specification, Samsung Electronics, May 3, 2005, 43 pages.

Samsung Electronics, "OneNAND™ Specification", Ver. 1.2, Dec. 23, 2005, 125 pages.

STMicroelectronics Group, "2Mbit, Low Voltage, Serial Flash Memory With 40 MHz SPI Bus Interface", Technical Specification, Aug. 2005, 40 pages.

Silicon Storage Technology INC., "16 Mbit SPI Serial Flash", SST25VF016B, Preliminary Specifications, © 2005, 28 pages.

Spansion Llc, "S70GL01GN00 MirrorBit Flash, 1024 Megabit, 3.0 Volt-only Page Mode Flash Memory Featuring 110 nm MirrorBit Process Technology, Data Sheet", Jun. 1, 1995, 83 pgs.

Tal, A., "Guidelines for Integrating DiskOnChip in a Host System", AP-DOC-1004, Rev. 1.0, M-Systems Flash. Pioneers Ltd., pp. 1-15, 2004.

Toshiba America Electronics Components Inc., "NAND Flash Applications Design Guide", Revision 1.0, Apr. 2003, 29 pages.

Takahiko Hara et al., "A 146-mm2 8-Gb Multi-Level NAND Flash Memory With 70-nm CMOS Technology", IEEE J. of Solid-State Circuits, vol. 41, No. 1, Jan. 2006, pp. 161-169.

Seungjae Lee et al., "A 3.3V 4Gb Four-Level Nand Flash Memory with 90nm CMOS Technology", ISSCC 2004/ Session 2/Non-Volatile Memory/2.7, Feb. 15-19, 2004, 10 pages.

Spansion, "64 Megabit CMOS 3.0 Volt Flash Memory with 50MHz SPI (Serial Peripheral Interface) Bus", Data Sheet (Preliminary), Sep. 6, 2006, 32 pages.

Office Action issued by the United States Patent and Trademark Office on Mar. 24, 2011 in connection with U.S. Appl. No. 12/564,492, 10 pages.

Written Opinion of the International Searching Authority mailed on Apr. 19, 2010 in connection with International Patent Application PCT/CA2009/001860, 4 pages.

International Search Report mailed on Apr. 19, 2010 in connection with International Patent Application PCT/CA2009/001860, 5 pages.

Notice of Allowance and Fee(s) Due issued by the United States Patent and Trademark Office on Jun. 10, 2011 in connection with U.S. Appl. No. 12/337,841, 9 pages.

* cited by examiner

US 8,194,481 B2

SEMICONDUCTOR DEVICE WITH MAIN MEMORY UNIT AND AUXILIARY MEMORY UNIT REQUIRING PRESET OPERATION

CROSS-REFERENCE TO RELATED APPLICATIONS

The present application is a continuation-in-part (CIP) of U.S. patent application Ser. No. 12/337,841, filed on Dec. 18, 2008, now U.S. Pat. No. 8,037,235 hereby incorporated by reference herein. Benefit is claimed under 35 USC §120.

The present application is also a continuation-in-part (CIP) of U.S. patent application Ser. No. 12/564,492, filed on Sep. 22, 2009, hereby incorporated by reference herein. Benefit is claimed under 35 USC §120.

The present application also claims the benefit under 35 USC §119(e) of U.S. Provisional Patent Application Ser. No. 61/213,990, filed Aug. 5, 2009, hereby incorporated by reference herein.

BACKGROUND

Semiconductor memory is used in a variety of applications. One of the most useful and widely employed types of semiconductor memory is SRAM, or static random access memory. As long as power can be continuously supplied to the cells of an SRAM array, this type of semiconductor memory allows fast access for both reading and writing individual memory cells.

In some applications, SRAM cells in a secondary array are used as a status indicator (e.g., cell validity) for corresponding memory cells in a primary array. For example, a given SRAM cell can be set to "1" when the corresponding memory cell in the primary array is deemed "valid"; prior to this event, the given SRAM cell will be expected to carry the value "0", thereby indicating that the corresponding primary cell is invalid. The use of a secondary SRAM array thus allows an external entity to rapidly access information about the validity of the cells in the primary array without having to access the primary array. This can be useful when the primary array is manufactured using a type of memory that may not allow individual cells to be as flexibly or as quickly accessed as in SRAM.

However, because SRAM cells acquire an unpredictable value upon power-up, an initialization ("preset") operation is required in order to guarantee that the given SRAM cell will indeed carry the value "0" before being written to with a "1", or vice versa. Applying this initialization operation to all SRAM cells in an array can lead to a cumbersome and lengthy preset phase.

It will be appreciated that a preset phase is required in many applications involving the use of SRAM. Improvements in the area of presetting the cells of a semiconductor memory array are therefore welcome.

SUMMARY

A first broad aspect of the present invention seeks to provide a semiconductor device, comprising: a main memory unit including a plurality of main cells; an auxiliary memory unit including a plurality of auxiliary cells arranged into rows and columns, each of the auxiliary cells corresponding to a respective set of the main cells; a plurality of wordlines each connected to a respective row of the auxiliary cells; a plurality of bitlines each connected to a respective column of the auxiliary cells; row decoder circuitry for selecting, in a first mode of operation, an individual wordline among the plurality of wordlines and, in a second mode of operation, a group of wordlines within the plurality of wordlines; bitline control circuitry for driving the bitlines to enable writing of auxiliary cells connected to a wordline that has been selected; control logic circuitry for (i) controlling the bitline control circuitry while the row decoder circuitry operates in the second mode of operation so as to set each of the auxiliary cells to a first logic state; (ii) causing input data to be written to selected ones of the main cells; and (iii) controlling the bitline control circuitry while the row decoder circuitry operates in the first mode of operation so as to set those auxiliary cells corresponding to the selected ones of the main cells to a second logic state different from the first logic state.

In an embodiment, the main cells and the auxiliary cells can be static random access memory (SRAM) cells.

In an embodiment, the SRAM cells can be single-port SRAM cells.

In an embodiment, the plurality of bitlines can comprise, for each column of the auxiliary cells, a respective pair of bitlines connected thereto.

In an embodiment, the first logic state can be a logic state indicative of data in the main memory unit having a first status.

In an embodiment, the second logic state can be a logic state indicative of data in the main memory unit having a second status.

In an embodiment, the first logic state can be logic zero and the second logic state can be logic one.

In an embodiment, each of the auxiliary cells can correspond to a respective set of exactly one of the main cells.

In an embodiment, each of the auxiliary cells can correspond to a respective set of at least two of the main cells.

A second broad aspect of the present invention seeks to provide a method for execution by a semiconductor device, comprising: selecting a group of rows of auxiliary cells forming part of an auxiliary memory unit, the auxiliary cells being arranged into rows and columns; driving a plurality of bitlines each connected to a respective column of the auxiliary cells, so as to set each of the auxiliary cells to a first logic state; writing input data to selected ones of a plurality of main cells, wherein each of the auxiliary cells corresponds to a respective set of the main cells; selecting a particular row of auxiliary cells that includes at least one auxiliary cell whose corresponding set of main cells includes at least one of the selected cells; driving the bitlines so as to set the at least one auxiliary cell to a second logic state different from the first logic state.

A third broad aspect of the present invention seeks to provide a computer-readable storage medium storing instructions which, when processed by a computer, are used to generate control logic circuitry configured to: select a group of rows of auxiliary cells forming part of an auxiliary memory unit, the auxiliary cells being arranged into rows and columns; drive a plurality of bitlines each connected to a respective column of the auxiliary cells, so as to set each of the auxiliary cells to a first logic state; cause input data to be written to selected ones of a plurality of main cells, wherein each of the auxiliary cells corresponds to a respective set of the main cells; select a particular row of auxiliary cells that includes at least one auxiliary cell whose corresponding set of main cells includes at least one of the selected cells; drive the bitlines so as to set the at least one auxiliary cell to a second logic state different from the first logic state.

A fourth broad aspect of the present invention seeks to provide a semiconductor device, comprising: a main memory unit including a plurality of main cells; an auxiliary memory unit including a plurality of sub-units, each sub-unit comprising a plurality of auxiliary cells arranged into rows and columns, each of the auxiliary cells corresponding to a respective set of the main cells; a plurality of wordlines each connected to a respective row of the auxiliary cells; a plurality of bitlines each connected to a respective column of the auxiliary cells and spanning the plurality of sub-units; row decoder circuitry for selecting, in a first mode of operation, an individual wordline among the plurality of wordlines of a particular one of the sub-units and, in a second mode of operation, a group of wordlines including at least one wordline from each of at least two of the sub-units; bitline control circuitry for driving the bitlines to enable writing of auxiliary cells connected to a wordline that has been selected; control logic circuitry for (i) controlling the bitline control circuitry while the row decoder circuitry operates in the second mode of operation so as to set each of the auxiliary cells in each of the sub-units to a first logic state; (ii) causing input data to be written to selected ones of the main cells; and (iii) controlling the bitline control circuitry while the row decoder circuitry operates in the first mode of operation so as to set those auxiliary cells corresponding to the selected ones of the main cells to a second logic state different from the first logic state.

In an embodiment, the main cells and the auxiliary cells can be static random access memory (SRAM) cells.

In an embodiment, the SRAM cells can be single-port SRAM cells.

In an embodiment, the plurality of bitlines can comprise, for each column of the auxiliary cells, a respective pair of bitlines connected thereto.

In an embodiment, the first logic state can be a logic state indicative of data in the main memory unit having a first status.

In an embodiment, the second logic state can be a logic state indicative of data in the main memory unit having a second status.

In an embodiment, the first logic state can be logic zero and the second logic state can be logic one.

In an embodiment, each of the auxiliary cells can correspond to a respective set of exactly one of the main cells.

In an embodiment, each of the auxiliary cells can correspond to a respective set of at least two of the main cells.

A fifth broad aspect of the present invention seeks to provide a method for execution by a semiconductor device, comprising: selecting a group of rows of auxiliary cells including at least one row from each of at least two sub-units, the auxiliary cells in each of the sub-units being arranged into rows and columns; driving a plurality of bitlines each connected to a respective column of the auxiliary cells and spanning the plurality of sub-units, so as to set each of the auxiliary cells to a first logic state; writing input data to selected ones of a plurality of main cells, wherein each of the auxiliary cells corresponds to a respective set of the main cells; selecting a particular row of a particular one of the sub-units, the particular row including at least one auxiliary cell whose corresponding set of main cells includes at least one of the selected cells; driving the bitlines so as to set the at least one auxiliary cell to a second logic state different from the first logic state.

A sixth broad aspect of the present invention seeks to provide a computer-readable storage medium storing instructions which, when processed by a computer, are used to generate control logic circuitry configured to: select a group of rows of auxiliary cells including at least one row from each of at least two sub-units, the auxiliary cells in each of the sub-units being arranged into rows and columns; drive a plurality of bitlines each connected to a respective column of the auxiliary cells and spanning the plurality of sub-units, so as to set each of the auxiliary cells to a first logic state; cause input data to be written to selected ones of a plurality of main cells, wherein each of the auxiliary cells corresponds to a respective set of the main cells; select a particular row of a particular one of the sub-units, the particular row including at least one auxiliary cell whose corresponding set of main cells includes at least one of the selected cells; drive the bitlines so as to set the at least one auxiliary cell to a second logic state different from the first logic state.

A seventh broad aspect of the present invention seeks to provide a semiconductor device, comprising: a main memory unit including a plurality of main cells arranged into an array of N1 rows and M1 columns; an auxiliary memory unit including a plurality of auxiliary cells arranged into N2 rows and M2 columns, each of the auxiliary cells corresponding to a respective set of Z main cells, N2 being less than N1 and M2 being greater than M1/Z; a plurality of wordlines each connected to a respective row of the auxiliary cells; a plurality of bitlines each connected to a respective column of the auxiliary cells; row decoder circuitry for selecting an individual wordline among the plurality of wordlines; bitline control circuitry for driving the plurality of bitlines to enable writing of auxiliary cells connected to the selected wordline; control logic circuitry for (i) controlling the bitline control circuitry so as to set each of the auxiliary cells to a first logic state; (ii) causing input data to be written to selected ones of the main cells; and (iii) controlling the bitline control circuitry so as to set those auxiliary cells corresponding to the selected ones of the main cells to a second logic state different from the first logic state.

In an embodiment, the main cells and the auxiliary cells can be static random access memory (SRAM) cells.

In an embodiment, the SRAM cells can be single-port SRAM cells.

In an embodiment, the plurality of bitlines can comprise, for each column of the auxiliary cells, a respective pair of bitlines connected thereto.

In an embodiment, the first logic state can be a logic state indicative of data in the main memory unit having a first status.

In an embodiment, the second logic state can be a logic state indicative of data in the main memory unit having a second status.

In an embodiment, the first logic state can be logic zero and the second logic state can be logic one.

In an embodiment, Z can be equal to one.

In an embodiment, Z can be greater than one.

In an embodiment, N1 can be at least as great as twice N2.

In an embodiment, M2 can be at least as great as M1/4.

An eighth broad aspect of the present invention seeks to provide a method for execution by a semiconductor device, comprising: writing input data to selected ones of a plurality of main cells forming part of a main memory unit, the main cells of the main memory unit being arranged into N1 rows and M1 columns; prior to said writing, driving a plurality of bitlines each connected to a respective column of auxiliary cells forming part of an auxiliary memory unit, so as to set each of the auxiliary cells to a first logic state, each of the auxiliary cells corresponding to a respective set of Z main cells, the auxiliary cells of the auxiliary memory unit being arranged into N2 rows and M2 columns, N2 being less than N1 and M2 being greater than M1/Z; selecting a particular row of auxiliary cells that includes at least one auxiliary cell whose corresponding set of main cells includes at least one of the selected cells; driving the bitlines so as to set the at least one auxiliary cell to a second logic state different from the first logic state.

A ninth broad aspect of the present invention seeks to provide a computer-readable storage medium storing instructions which, when processed by a computer, are used to generate control logic circuitry configured to: cause input data to be written to selected ones of a plurality of main cells forming part of a main memory unit, the main cells of the main memory unit being arranged into N1 rows and M1 columns; prior to the input data being written to the selected ones of the plurality of main cells, drive a plurality of bitlines each connected to a respective column of auxiliary cells forming part of an auxiliary memory unit, so as to set each of the auxiliary cells to a first logic state, each of the auxiliary cells corresponding to a respective set of Z main cells, the auxiliary cells of the auxiliary memory unit being arranged into N2 rows and M2 columns, N2 being less than N1 and M2 being greater than M1/Z; select a particular row of auxiliary cells that includes at least one auxiliary cell whose corresponding set of main cells includes at least one of the selected cells; drive the bitlines so as to set the at least one auxiliary cell to a second logic state different from the first logic state.

A tenth broad aspect of the present invention seeks to provide a semiconductor device, comprising: a plurality of single-ported memory cells; a plurality of dual-ported memory cells arranged into rows and columns, each of the dual-ported memory cells corresponding to a respective set of single-ported memory cells; first wordlines and second wordlines connected to the rows of the dual-ported memory cells such that each row of the dual-ported memory cells is connected to a corresponding one of the first wordlines and a corresponding one of the second wordlines; first biltines and second biltines connected to the columns of the dual-ported memory cells such that each column of the dual-ported memory cells is connected to a corresponding set of the first bitlines and a corresponding set of the second bitlines; row decoder circuitry for jointly selecting at least one of the first wordlines and at least one of the second wordlines; bitline control circuitry for driving the first bitlines to enable writing of dual-ported memory cells connected to a first wordline that has been selected and for driving the second bitlines to enable writing of dual-ported memory cells connected to a second wordline that has been selected; control logic circuitry for (i) controlling the bitline control circuitry so as to set each of the dual-ported memory cells to a first logic state; (ii) causing input data to be written to selected ones of the single-ported memory cells and (iii) controlling the bitline control circuitry so as to set those dual-ported memory cells corresponding to the selected ones of the single-ported memory cells to a second logic state different from the first logic state.

In an embodiment, the single-ported memory cells and the dual-ported memory cells can be static random access memory (SRAM) cells.

In an embodiment, the corresponding set of the first bitlines connected to each column can include a pair of the first bitlines.

In an embodiment, the corresponding set of the second bitlines connected to each column can include a pair of the second bitlines.

In an embodiment, the first logic state can be a logic state indicative of data in the single-ported memory cells having a first status.

In an embodiment, the second logic state can be a logic state indicative of data in the single-ported memory cells having a second status.

In an embodiment, the first logic state can be logic zero and the second logic state can be logic one.

In an embodiment, the single-ported memory cells can occupy a first memory unit and the dual-ported memory cells occupy a second memory unit.

In an embodiment, the control logic circuitry can be configured to control the bitline control circuitry so as to set each of the dual-ported memory cells to the first logic state upon receipt of a command from an external entity.

In an embodiment, the external entity can comprise an off-chip controller and the command can comprise a preset command.

In an embodiment, the control logic circuitry can be configured to cause the input data to be written to the selected ones of the single-ported memory cells upon receipt of a command from an external entity.

In an embodiment, the external entity can comprise an off-chip controller and the command can comprise a write command identifying a start address from which the selected ones of the single-ported memory cells can be determined.

In an embodiment, the control logic circuitry can be configured to control the bitline control circuitry so as to set those dual-ported memory cells corresponding to the selected ones of the single-ported memory cells to the second logic state upon completion of writing of the input data.

In an embodiment, controlling the bitline control circuitry so as to set each of the dual-ported memory cells to the first logic state can comprise (i) selecting a column of the dual-ported memory cells; (ii) setting to the first logic state each dual-ported cell in the selected column and that is connected to a first wordline or a second wordline that has been selected; and (iii) repeating the selecting and the setting for each of the other columns of the dual-ported memory cells.

In an embodiment, controlling the bitline control circuitry so as to set each of the dual-ported memory cells to the first logic state can comprise (i) selecting a plurality of the columns of the dual-ported memory cells; (ii) simultaneously setting to the first logic state those dual-ported cells in the selected columns that are connected to a first wordline or a second wordline that has been selected; and (iii) repeating the selecting and the simultaneously setting for multiple other pluralities of the columns of the dual-ported memory cells.

In an embodiment, controlling the bitline control circuitry so as to set each of the dual-ported memory cells to the first logic state can comprise simultaneously setting to the first logic state all dual-ported memory cells connected to a first wordline or a second wordline that has been selected.

In an embodiment, each of the dual-ported memory cells can correspond to a respective set of exactly one of the single-ported memory cells.

In an embodiment, each of the dual-ported memory cells can correspond to a respective set of at least two of the single-ported memory cells.

An eleventh broad aspect of the present invention seeks to provide a method for execution by a semiconductor device, comprising: setting each of a plurality of dual-ported memory cells to a first logic state; writing input data to selected ones of a plurality of single-ported memory cells, wherein each of the dual-ported memory cells corresponds to a respective set of single-ported memory cells; setting those dual-ported memory cells corresponding to the selected ones of the single-ported memory cells to a second logic state different from the first logic state.

A twelfth broad aspect of the present invention seeks to provide a computer-readable storage medium storing instructions which, when processed by a computer, are used to generate control logic circuitry configured to: set each of a plurality of dual-ported memory cells to a first logic state; cause input data to be written to selected ones of a plurality of single-ported memory cells, wherein each of the dual-ported memory cells corresponds to a respective set of single-ported memory cells; set those dual-ported memory cells corresponding to the selected ones of the single-ported memory cells to a second logic state different from the first logic state.

These and other aspects and features of the present invention will now become apparent to those of ordinary skill in the art upon review of the following description of specific embodiments of the invention in conjunction with the accompanying drawings.

It is to be expressly understood that the description and drawings are only for the purpose of illustration of certain embodiments of the invention and are an aid for understanding. They are not intended to be a definition of the limits of the invention.

DETAILED DESCRIPTION

Figure 1:
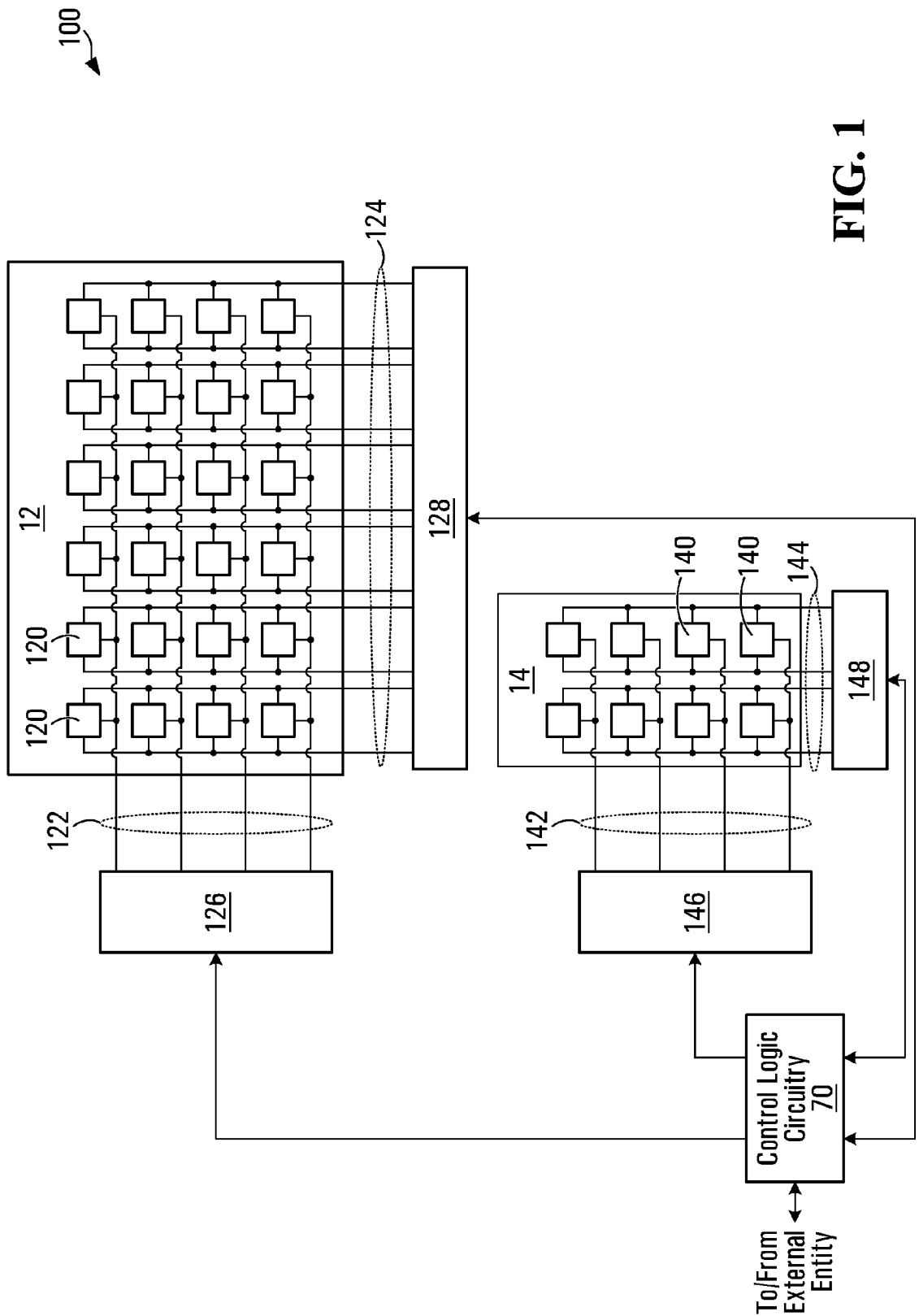
FIG. 1 is a block diagram of a semiconductor device including a main memory unit and an auxiliary memory unit, in accordance with a specific non-limiting embodiment of the present invention.
Figure 8A:
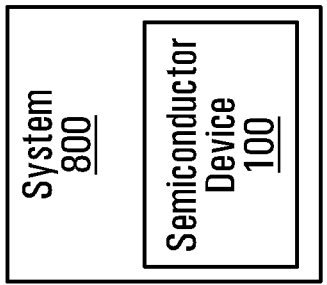
FIGS. 8A-8E are block diagrams of the semiconductor devices of FIGS. 1 and 3-6 embedded in a system.

Reference is made to FIG. 1, which shows a semiconductor device 100 comprising a main memory unit 12 and an auxiliary memory unit 14, in accordance with a specific non-limiting embodiment. The semiconductor device 100 may also comprise other components that are not illustrated. With reference to FIG. 8A, in accordance with specific non-limiting embodiments of the present invention, the semiconductor device 100 can be embedded in a system 800. The system 800 may be, for example, an ASIC (application-specific integrated circuit) or a SoC (system on chip), to name a few non-limiting possibilities.

The main memory unit 12 comprises a plurality of cells 120. The auxiliary memory unit 14 comprises a plurality of cells 140 in the form of an array of rows and columns. The cells 120 in the main memory unit 12 can similarly be arranged in the form of an array. The cells 140 in the auxiliary memory unit 14 are each associated with a set of one or more cells 120 in the main memory unit 12. In the illustrated embodiment, which is provided for illustrative purposes only, the main memory unit 12 has four (4) rows of six (6) columns of cells 120, the auxiliary memory unit 14 has four (4) rows of two (2) columns of cells 140, and each cell in the auxiliary memory unit 14 is associated with a set of three (3) cells in the main memory unit 12. In other examples, one bit's worth of information in the auxiliary memory unit 14 represents status information (such as, for example, validity, freshness, mask-worthiness, etc.) for one byte's worth of information in the main memory unit 12. However, it is to be understood that there is no particular limitation on the number of rows or columns in the auxiliary memory unit 14 or on the number of main memory unit cells in a set that is associated with an auxiliary unit cell.

Figure 2:
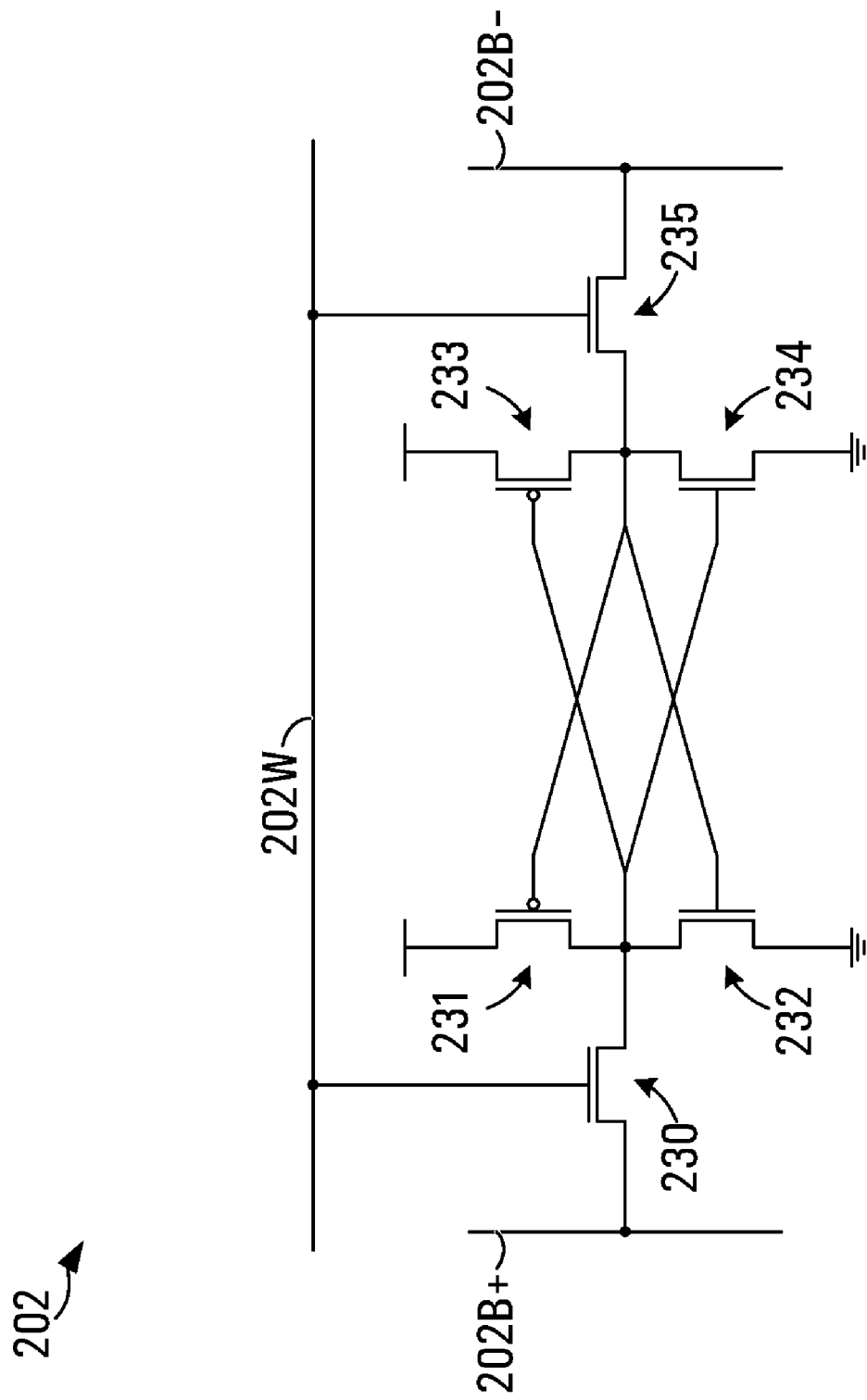
FIG. 2 is a circuit diagram of a single-port SRAM memory cell.

In a specific non-limiting embodiment, the cells 140 of the auxiliary memory unit 14 may comprise metal oxide semiconductor (MOS) static random access memory (SRAM) cells. Specifically, FIG. 2 shows a single-port SRAM cell 202 having six (6) MOS transistors 230, 231, 232, 233, 234, 235, a wordline 202W and two bitlines 202B+, 202B−. The cell 202 can be read from or written to by controlling the wordline 202W and the bitlines 202B+, 202B−. The wordline 202W is set to high (i.e., "selected" or "asserted") for both read and write operations. For a read operation, both bitlines 202B+ and 202B− are sensed after they have been precharged to a high level. A high value on one of the bitlines 202B+, 202B− does not change the value in the cell 202, instead the cell 202 will pull one of the bitlines 202B+, 202B− low. Depending on which of the bitlines 202B+, 202B− is pulled low, this will be interpreted as either a logic "0" or a logic "1". For a write operation, one of the bitlines 202B+, 202B− is forced low, and the other is forced high. The low value overpowers the PMOS transistor (either 231 or 233) connected to the bitline that was forced low, which results in the cell 202 being written to. Depending on which of the bitlines 202B+, 202B− was forced low, this will write either a logic "0" or a logic "1" to the cell 202.

The cells 120 of the main memory unit may similarly be SRAM cells. It is to be understood that other types of memory cells with a wordline and bitline structure can be employed in the main memory unit 12 and the auxiliary memory unit 14 without departing from the scope of certain embodiments the present invention. Examples of such other types of memory cells include dynamic random access memory (DRAM).

Returning now to FIG. 1, the semiconductor device 100 comprises a plurality of wordlines 142, each connected to a respective row of the cells 140 of the auxiliary memory unit 14. Row decoder circuitry 146 is provided for control of the wordlines 142. Specifically, when a particular auxiliary memory unit cell (i.e., a particular one of the cells 140 of the auxiliary memory unit 14) is to be read from or written to, the wordline connected to the row in which that particular auxiliary memory unit cell is located is selected by row decoder circuitry 146. Row decoder circuitry 146 is operable in a normal mode of operation and in a preset mode of operation. In the normal mode of operation, row decoder circuitry 146 selects an individual wordline among the plurality of wordlines 142. In the preset mode of operation, row decoder circuitry 146 jointly selects a group of two or more wordlines within the plurality of wordlines 142. For more information regarding the selection of multiple wordlines, the reader is referred U.S. Provisional Patent Application Ser. No. 61/213,990, filed Aug. 5, 2009 and U.S. patent application Ser. No. 12/564,492, filed on Sep. 22, 2009, hereby incorporated by reference herein. The particular mode in which row decoder circuitry 146 operates, as well as the identity of the row or rows containing cells to be read from or written to, is provided by control logic circuitry 70.

The semiconductor device 100 further comprises a plurality of bitlines 144 each connected to a respective column of the cells 140 of the auxiliary memory unit 14. It is remarked that when single-port cells of the type shown in FIG. 2 are used in the auxiliary memory unit 14, each of the auxiliary memory unit cells is connected to a pair of the bitlines 144. Bitline control circuitry 148 (e.g., including a driver and a sense amplifier) is provided for control of the bitlines 144. Operation of bitline control circuitry 148 differs depending on whether a read or write operation is being performed. For a write operation, bitline control circuitry 148 is configured to drive the bitlines 144 connected to a selected column of the auxiliary memory unit 14 so that each cell in that column which is connected to a wordline that has been selected can be written to, i.e., set to a desired logic state (e.g., logic "0" or logic "1"). It should be appreciated that plural columns of the auxiliary memory unit 14 may be selected either simultaneously or in sequence. The identity of the selected column or columns, as well as the value of the data to be written, is provided by the control logic circuitry 70. A column or columns of the auxiliary memory unit 14 are similarly identified by the control logic circuitry 70 during a read operation.

The semiconductor device 100 also comprises a plurality of wordlines 122, each connected to a respective row of the cells 120 of the main memory unit 12. Row decoder circuitry 126 is provided for control of the wordlines 122. Specifically, when a particular main memory unit cell (i.e., a particular one of the cells 120 of the main memory unit 12) is to be read from or written to, the wordline connected to the row in which that particular main memory unit cell is located is selected by row decoder circuitry 126. The identity of the row containing cells to be read from or written to is provided by the control logic circuitry 70.

The semiconductor device 100 further comprises a plurality of bitlines 124 each connected to a respective column of the cells 120 of the main memory unit 12. It is remarked that when single-port cells of the type shown in FIG. 2 are used in the main memory unit 12, each of the main memory unit cells is connected to a pair of the bitlines 124. Bitline control circuitry 128 is provided for control of the bitlines 124. Operation of bitline control circuitry 128 differs depending on whether a read or write operation is being performed. For a write operation, bitline control circuitry 128 is configured to drive the bitlines 124 connected to a selected column of the main memory unit 12 so that each cell in that column which is connected to a wordline that has been selected can be written to, i.e., set to a desired logic state (e.g., logic "0" or logic "1"). It should be appreciated that plural columns of the main memory unit 12 may be selected either simultaneously or in sequence. The identity of the selected column or columns, as well as the value of the data to be written, is provided by the control logic circuitry 70. A column or columns of the main memory unit 12 are similarly identified by the control logic circuitry 70 during a read operation.

In operation, control logic circuitry 70 processes commands received from an external entity, such as an off-chip controller (not shown). These commands can include a preset command, a write command and a read command, among others. In a non-limiting example, a preset command received from the external entity can indicate that the data in the main memory unit 12 should be considered as being "stale", "mask-worthy" (i.e., requiring application of a mask), "not valid", etc. Thereafter, a write command may be received from the external entity with the intention of writing data to a particular cell or group of cells in the main memory unit 12, starting at a start address. In order to track the status (for example, valid or not valid, fresh or stale, mask-worthy or not mask-worthy, etc.) of the main memory unit cells (i.e., the cells 120 in the main memory unit 12), a set of one or more main memory unit cells is associated with a corresponding cell in the auxiliary memory unit 14. The auxiliary memory unit cells can then each represent a single bit of information indicative of the particular status (e.g., valid or not valid, fresh or stale, mask-worthy or not mask-worthy, etc.) of a corresponding set of, say, three (3) main memory unit cells. Thus, it will be appreciated that at a given point in time, the external entity can establish the status of different cells in the main memory unit 12 by reading from the auxiliary memory unit 14. It is to be understood that the number of main memory unit 12 cells in each set represented by a given one of the auxiliary memory unit cells is not limited to three (3) or any other specific value.

In response to receipt of the preset command, control logic circuitry 70 performs a preset operation on the auxiliary memory unit 14. The aim of the preset operation is to cause each of the cells 140 in the auxiliary memory unit 14 to acquire a particular logic state (e.g., logic "1") that is indicative of the corresponding set of cells in the main memory unit 12 having a first particular status (for example, "not valid", "stale", "mask-worthy", etc.). To this end, the control logic circuitry 70 identifies a group of two or more rows of the auxiliary memory unit 14 to row decoder circuitry 146 and places row decoder circuitry 146 in the aforementioned preset mode of operation, thereby resulting in the selection of a group of wordlines corresponding to the two or more identified rows. If row decoder circuitry 146 is configured to automatically select all of the wordlines 142 when placed in the preset mode of operation, then there is no need to explicitly identify the group of two or more rows to row decoder circuitry 146, since their identification will be implicit by the act of placing row decoder circuitry 146 in the preset mode of operation.

Having placed row decoder circuitry 146 in the preset mode of operation, the control logic circuitry 70 controls bitline control circuitry 148 so as to ultimately set each of the auxiliary cells 140 to the particular logic state (in this case, logic "1"). In an example, assuming that a number of wordlines 142 has been jointly selected through action of row decoder circuitry 146, the bitlines 144 for a single column can be controlled by the control logic circuitry 70 so as to simultaneously set all cells in that column, which are connected to a wordline that has been selected, to logic "1". The process can then be repeated for a next column, and so on. In another example, the bitlines 144 for plural columns can be controlled so as to simultaneously set all cells in each of those columns, which are connected to a wordline that has been selected, to logic "1".

If the number of jointly selected wordlines is less than all of the wordlines 142, then the aforementioned bitline control process is repeated for a new set of wordlines. Ultimately, all the cells 140 in the auxiliary memory unit 14 will have acquired the particular logic state (in this case, logic "1") indicative of the cells 120 in the main memory unit 12 having the first particular status (e.g., "not valid", "stale", "mask-worthy", etc.), and the preset operation is said to be complete.

At this stage, the writing of input data to the main memory unit 12 can proceed. To this end, the control logic circuitry 70 processes a write command which can identify a start address in the main memory unit 12 and can contain data to be written, starting at the start address. The start address is represented by a particular cell located at a particular row and a particular column in the main memory unit 12, and is thus associated with a particular wordline and a particular pair of bitlines. The control logic circuitry 70 identifies the particular row to row decoder circuitry 126. The control logic circuitry 70 then controls bitline control circuitry 128 so that the particular pair of bitlines will set the particular main memory unit cell to a logic state that corresponds to the value of the input data being written to the start address. Additional control of the bitlines 124 and the wordlines 122 is carried out for other ones of the cells 120 being subsequently written to. This will result in a certain number of main memory unit cells having been written to with data having a second particular status (e.g., "valid", "fresh", "not mask-worthy", etc.).

In order to record the change in status of these main memory unit cells, the control logic circuitry 70 ensures that the contents of the auxiliary memory unit cells that correspond to the main memory unit cells that were written to are toggled to a logic state (e.g., logic "0") that is indicative of data having the second particular status (rather than the first particular status acquired previously). To this end, the control logic circuitry 70 determines the specific row and specific column of the auxiliary memory unit cell whose corresponding set of main memory unit cells includes the particular cell at the start address mentioned above. The control logic circuitry 70 identifies the specific row to row decoder circuitry 146 and places row decoder circuitry 146 in the normal mode of operation, resulting in selection of a specific one of the wordlines 142 in the auxiliary memory unit 14. The control logic circuitry 70 then controls bitline control circuitry 148 so that a specific pair of bitlines corresponding to the specific column will set to logic "0" the auxiliary memory unit cell whose corresponding set of main memory unit cells includes the particular cell at the start address. The change in status of this corresponding set of main memory unit cells is thus recorded, and the process is repeated for other auxiliary memory unit cells for which the corresponding sets of cells in the main memory unit were also written to.

It should be appreciated that the control logic circuitry 70 can combine the cells 140 in the auxiliary memory unit 14 with the cells 120 in the main memory unit 12 in any desired way. For example, a masking operation may be performed so as to individually logically combine (e.g., in an AND operation, an OR operation, an XOR operation, etc.) the logic value of each of the cells 140 in the auxiliary memory unit 14 with the logic value of each of the cells 120 in the associated set of cells in the main memory unit 12, resulting in a new set of logic values. In such a way, the cells 140 in the auxiliary memory unit 14 can be used as a mask for sets of cells 120 in the main memory unit 12. Such a masking operation may be useful when transferring information to a virtual page buffer in a non-volatile memory device, so as to prevent unwanted writing of memory elements in the non-volatile memory device.

Subsequent write operations will similarly impact other sets of main memory unit cells and their corresponding cells 140 in the auxiliary memory unit 14. In the case where a given cell in the main memory unit 12 is deemed to be "valid", "fresh" or "not mask-worthy" (by virtue of the logic value of the corresponding cell in the auxiliary memory unit 14), it may continue to be deemed "valid", "fresh" or "not mask-worthy" even as it is rewritten with other data, until the next preset operation occurs. Alternatively, the status may change back to the first particular status (for example, "not valid", "stale", "mask-worthy", etc.) as soon as it is rewritten.

It should be appreciated that the main and auxiliary memory units 12, 14 can be implemented as independent entities that are under control of the control logic circuitry 70. Thus, for example, separate compiler routines can be written to custom define the main memory unit 12 and the auxiliary memory unit 14. This allows the dimensionality of the main memory unit 12 and the auxiliary memory unit 14 to be chosen independently, irrespective of parameters such as the number of main memory unit cells in each set corresponding to an auxiliary unit cell.

Figure 8B:
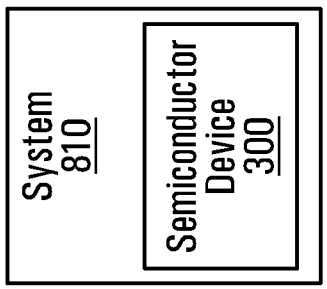

In another embodiment, it is possible to define a single memory structure that includes the main memory unit and the auxiliary memory unit as closely interconnected components, which can lead to economies of semiconductor chip real estate. To this end, reference is made to FIG. 3, which shows a semiconductor device 300 with the aforementioned main memory unit 12 and an auxiliary memory unit 304 each having the same number of rows and a number of columns that may differ. With reference to FIG. 8B, in accordance with specific non-limiting embodiments of the present invention, the semiconductor device 300 can be embedded in a system 810. The system 810 may be, for example, an ASIC (application-specific integrated circuit) or a SoC (system on chip), to name a few non-limiting possibilities.

In the illustrated embodiment, which is provided for illustrative purposes only, the main memory unit 12 has four (4) rows of six (6) columns of cells, the auxiliary memory unit 304 has four (4) rows of two (2) columns of cells, and each cell in the auxiliary memory unit 304 is associated with a set of three (3) cells in the main memory unit 12. In other examples, one bit's worth of information in the auxiliary memory unit 304 represents status information (such as, for example, validity, freshness, mask-worthiness, etc.) for one byte's worth of information in the main memory unit 12. However, it is to be understood that there is no particular limitation on the number of rows or columns or on the number of main memory unit cells in a set that is associated with an auxiliary unit cell.

Due to the fact that the number of rows is the same, a plurality of shared wordlines 312 is provided, the wordlines 312 being shared between the main memory unit 12 and the auxiliary memory unit 304. That is to say, if a given one of the wordlines 312 is connected to a given row of auxiliary memory unit cells containing a particular auxiliary memory unit cell, it is also connected to the row of main memory unit cells that includes the set of main memory unit cells corresponding to that particular auxiliary memory unit cell.

Figure 3:
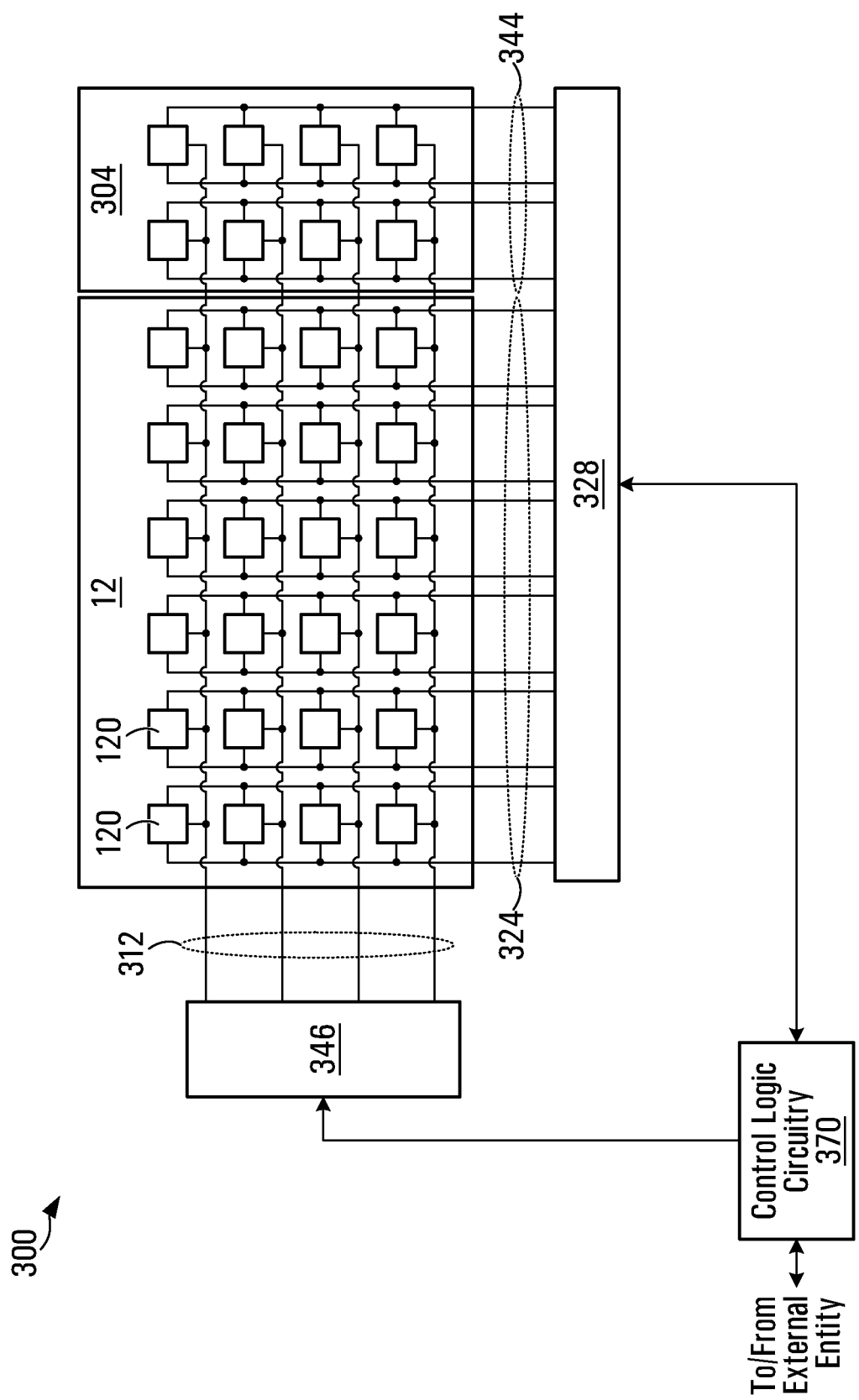
FIGS. 3-6 are block diagrams of semiconductor devices each including a main memory unit and an auxiliary memory unit, in accordance with other specific non-limiting embodiments of the present invention.

In the embodiment of FIG. 3, row decoder circuitry 346 is provided for control of only one set of wordlines, namely wordlines 312 which are shared between the main memory unit 12 and the auxiliary memory unit 304. Specifically, when a particular cell of the main memory unit 12 or the auxiliary memory unit 304 is to be read from or written to, the wordline connected to the row in which that particular cell is located is selected by row decoder circuitry 346. Row decoder circuitry 346 is operable in a normal mode of operation and in a preset mode of operation. In the normal mode of operation, row decoder circuitry 346 selects an individual wordline among the plurality of wordlines 312. In the preset mode of operation, row decoder circuitry 346 jointly selects a group of two or more wordlines within the plurality of wordlines 312. The particular mode in which row decoder circuitry 346 operates, as well as the identity of the row or rows containing the cell to be read from or written to, is controlled by control logic circuitry 370.

The semiconductor device 300 also comprises a plurality of main bitlines 324 each connected to a respective column of the cells of the main memory unit 12 and a plurality of auxiliary bitlines 344 each connected to a respective column of the cells of the auxiliary memory unit 304. It is remarked that when single-port cells of the type shown in FIG. 2 are used in the main memory unit 12 (or the auxiliary memory unit 304), each of the main memory unit cells (or auxiliary memory unit cells) is connected to a pair of the main bitlines 324 (or the auxiliary bitlines 344). Bitline control circuitry 328 is provided for control of the main bitlines 324 and the auxiliary bitlines 344. Operation of bitline control circuitry 328 differs depending on whether a read or write operation is being performed. For a write operation, bitline control circuitry 328 is configured to drive the main bitlines 324 (or the auxiliary bitlines 344) connected to a selected column of the main memory unit 12 (or the auxiliary memory unit 304) so that each cell in that column which is connected to a wordline that has been selected can be written to, i.e., set to a desired logic state (e.g., logic "0" or logic "1"). It should be appreciated that plural columns, from one or both of the main memory unit 12 and the auxiliary memory unit 304, may be selected either simultaneously or in sequence. The identity of the selected column or columns, as well as the value of the data to be written, is provided by the control logic circuitry 370. A column or columns of the auxiliary memory unit 304 are similarly identified by the control logic circuitry 370 during a read operation.

In operation, control logic circuitry 370 processes commands received from an external entity, such as an off-chip controller (not shown). These commands can include a preset command, a write command and a read command, among others. In a non-limiting example, a preset command received from the external entity can indicate that the data in the main memory unit 12 should be considered as being "stale", "mask-worthy" (i.e., requiring application of a mask), "not valid", etc. Thereafter, a write command may be received from the external entity with the intention of writing data to a particular cell or group of cells in the main memory unit 12, starting at a start address. In order to track the status (for example, valid or not valid, fresh or stale, mask-worthy or not mask-worthy, etc.) of the main memory unit cells (i.e., the cells in the main memory unit 12), a set of one or more main memory unit cells is associated with a corresponding cell in the auxiliary memory unit 304. The auxiliary memory unit cells can each represent a single bit of information indicative of the particular status (e.g., valid or not valid, fresh or stale, mask-worthy or not mask-worthy, etc.) of a corresponding set of, say, three (3) main memory unit cells. Thus, it will be appreciated that at a given point in time, the external entity can establish the status of different cells in the main memory unit 12 by reading from the auxiliary memory unit 304. It is to be understood that the number of cells of the main memory unit 12 represented by each of the cells in the auxiliary memory unit 304 is not limited to three (3) or any other specific value.

In response to receipt of the preset command, control logic circuitry 370 performs a preset operation on the auxiliary memory unit 304. The aim of the preset operation is to cause each of the cells in the auxiliary memory unit 304 to acquire a particular logic state (e.g., logic "1") that is indicative of the corresponding set of cells in the main memory unit 12 having a first particular status (for example, "not valid", "stale", "mask-worthy", etc.). To this end, the control logic circuitry 370 identifies a group of two or more rows of the auxiliary memory unit 304 to row decoder circuitry 346 and places row decoder circuitry 346 in the aforementioned preset mode of operation, thereby resulting in the selection of a group of wordlines corresponding to the two or more identified rows. If row decoder circuitry 146 is configured to automatically select all of the wordlines 312 when placed in the preset mode of operation, there is no need to explicitly identify the group of two or more rows to row decoder circuitry 346, since their identification will be implicit by the act of placing row decoder circuitry 346 in the preset mode of operation.

Having placed row decoder circuitry 346 in the preset mode of operation, the control logic circuitry 370 controls bitline control circuitry 328 so as to ultimately set each of the auxiliary cells to the particular logic state (in this case, logic "1"). In an example, assuming that a number of wordlines 312 has been jointly selected through action of row decoder circuitry 346, the auxiliary bitlines 344 for a single column can be controlled by the control logic circuitry 370 so as to simultaneously set all cells in that column, which are connected to a wordline that has been selected, to logic "1". The process can then be repeated for a next column, and so on. In another example, the auxiliary bitlines 344 for plural columns can be controlled so as to simultaneously set all cells in each of those columns, which are connected to a wordline that has been selected, to logic "1".

If the number of jointly selected wordlines is less than all of the wordlines 312, then the aforementioned bitline control process is repeated for a new set of wordlines. Ultimately, all the cells in the auxiliary memory unit 304 will have acquired the particular logic state (in this case, logic "1") indicative of the cells in the main memory unit 12 having the first particular status (for example, "not valid", "stale", "mask-worthy", etc.), and the preset operation is said to be complete.

At this stage, the writing of input data to the main memory unit 12 can proceed. To this end, the control logic circuitry 370 processes a write command which can identify a start address in the main memory unit 12 and can contain data to be written, starting at the start address. The start address is represented by a particular main memory unit cell located at a particular row and a particular column in the main memory unit 12, and is thus associated with a particular wordline and a particular pair of main bitlines. The control logic circuitry 370 identifies the particular row to row decoder circuitry 346. The control logic circuitry 370 places row decoder circuitry 346 in the normal mode of operation, thereby resulting in the selection of the particular wordline mentioned above. The control logic circuitry 370 then controls bitline control circuitry 328 so that the particular pair of main bitlines 324 will set the particular cell to a logic state that corresponds to the value of the input data being written to the start address. In addition, the control logic circuitry 370 ensures that the contents of the auxiliary memory unit cell that corresponds to the particular main memory unit cell that was written to is toggled to a different logic state (e.g., logic "0") that is indicative of data having a second particular status (e.g., "valid", "fresh", "not mask-worthy", etc.). This is done by determining the pair of auxiliary bitlines corresponding to the particular column of the particular main memory unit cell, while the same wordline remains selected. The control logic circuitry 370 then controls bitline control circuitry 328 so as to set to logic "0" the auxiliary memory unit cell whose corresponding set of main memory unit cells includes the particular main memory unit cell. It should be appreciated that because the same wordline remains selected, it is possible, although not essential, that the bitline control circuitry 328 simultaneously (or substantially simultaneously) controls a pair of main bitlines 324 and an associated pair of auxiliary bitlines 344, thereby writing to the main memory unit 12 and the auxiliary memory unit 304 at the same time.

The above-mentioned process is then repeated for other cells in the main memory unit 12 subsequently being written to, as well as for their corresponding cells in the auxiliary memory unit 304.

It should be appreciated that the control logic circuitry 370 can combine the cells in the auxiliary memory unit 304 with the cells 120 in the main memory unit 12 in any desired way. For example, a masking operation may be performed so as to individually logically combine (e.g., in an AND operation, an OR operation, an XOR operation, etc.) the logic value of each of the cells in the auxiliary memory unit 304 with the logic value of each of the cells 120 in the associated set of cells in the main memory unit 12, resulting in a new set of logic values. In such a way, the cells in the auxiliary memory unit 304 can be used as a mask for sets of cells 120 in the main memory unit 12. Such a masking operation may be useful when transferring information to a virtual page buffer in a non-volatile memory device, so as to prevent unwanted writing of memory elements in the non-volatile memory device.

Figure 4:
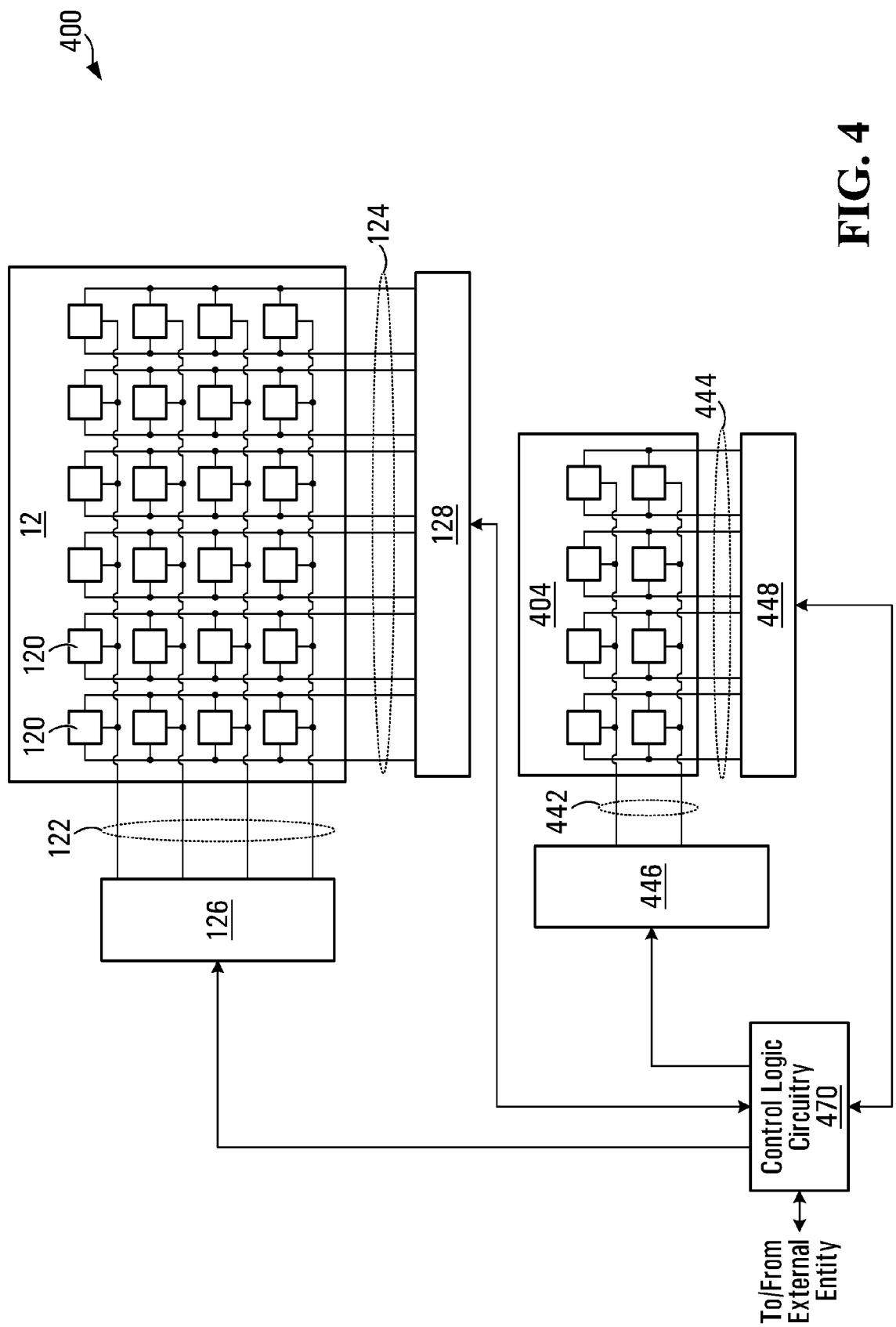
Figure 8C:
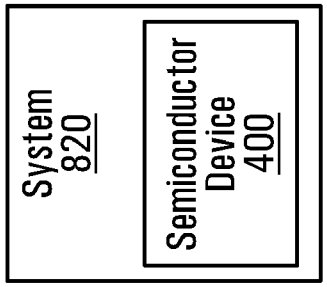

In accordance with another specific non-limiting embodiment, the auxiliary memory unit has fewer wordlines than the main memory unit. In particular, with reference to FIG. 4, there is shown a semiconductor device 400 with the aforementioned main memory unit 12 and an auxiliary memory unit 404. With reference to FIG. 8C, in accordance with specific non-limiting embodiments of the present invention, the semiconductor device 400 can be embedded in a system 820. The system 820 may be, for example, an ASIC (application-specific integrated circuit) or a SoC (system on chip), to name a few non-limiting possibilities.

The main memory unit 12 has four (4) rows of six (6) columns of cells, the auxiliary memory unit 404 has two (2) rows of four (4) columns of cells, and each cell in the auxiliary memory unit 404 is associated with a set of three (3) cells in the main memory unit 12. In other examples, one bit's worth of information in the auxiliary memory unit 404 represents status information (such as, for example, validity, freshness, mask-worthiness, etc.) for one byte's worth of information in the main memory unit 12. Generally speaking, in this embodiment, the main memory unit 12 has N1 rows of M1 columns of cells, the auxiliary memory unit 404 has N2 rows of M2 columns of cells and each cell in the auxiliary memory unit 404 is associated with a set of Z cells in the main memory unit 12, where Z is greater than or equal to 1. A feature of this specific non-limiting embodiment is that N2 is less than N1, i.e., the auxiliary memory unit 404 has fewer rows than the main memory unit 12, while the number of columns M2 in the auxiliary memory unit 404 is greater than M1/Z. Otherwise, there is no particular limitation on the values of M1, N1, M2, N2 or Z.

The semiconductor device 400 further comprises the aforementioned plurality of wordlines 122, each connected to a respective row of the cells of the main memory unit 12. Row decoder circuitry 126 is provided for control of the wordlines 122. Specifically, when a particular main memory unit cell is to be read from or written to, the wordline connected to the row in which that particular main memory unit cell is located is selected by row decoder circuitry 126. The identity of the row containing cells to be read from or written to is provided by control logic circuitry 470.

The semiconductor device 400 also comprises the aforementioned plurality of bitlines 124 each connected to a respective column of the cells of the main memory unit 12. It is remarked that when single-port cells of the type shown in FIG. 2 are used in the main memory unit 12, each of the main memory unit cells is connected to a pair of the bitlines 124. Bitline control circuitry 128 is provided for control of the bitlines 124. Operation of bitline control circuitry 128 differs depending on whether a read or write operation is being performed. For a write operation, bitline control circuitry 128 is configured to drive the bitlines 124 connected to a selected column of the main memory unit 12 so that each cell in that column which is connected to a wordline that has been selected can be written to, i.e., set to a desired logic state (e.g., logic "0" or logic "1"). It should be appreciated that plural columns of the main memory unit 12 may be selected either simultaneously or in sequence. The identity of the selected column or columns, as well as the value of the data to be written, is provided by the control logic circuitry 470. A column or columns of the main memory unit 12 are similarly identified by the control logic circuitry 470 during a read operation.

The semiconductor device 400 further comprises a plurality of wordlines 442, each connected to a respective row of the cells of the auxiliary memory unit 404. Row decoder circuitry 446 is provided for control of the wordlines 442. Specifically, when a particular auxiliary memory unit cell is to be read from or written to, the wordline connected to the row in which that particular auxiliary memory unit cell is located is selected by row decoder circuitry 446. Row decoder circuitry 446 is operable to select an individual wordline among the plurality of wordlines 442.

The semiconductor device 400 further comprises a plurality of bitlines 444 each connected to a respective column of the cells of the auxiliary memory unit 404. It is remarked that when single-port cells of the type shown in FIG. 2 are used in the auxiliary memory unit 404, two of the bitlines 444 are connected to each column. Bitline control circuitry 448 is provided for control of the bitlines 444. Operation of bitline control circuitry 448 differs depending on whether a read or write operation is being performed. For a write operation, bitline control circuitry 448 is configured to drive the bitlines 444 connected to a selected column of the auxiliary memory unit 404 so that each cell in that column which is connected to a wordline that has been selected can be written to, i.e., set to a desired logic state (e.g., logic "0" or logic "1"). It should be appreciated that plural columns of the auxiliary memory unit 404 may be selected either simultaneously or in sequence. The identity of the selected column or columns, as well as the value of the data to be written, is provided by the control logic circuitry 470. A column or columns of the auxiliary memory unit 404 are similarly identified by the control logic circuitry 470 during a read operation.

In operation, control logic circuitry 470 processes commands received from an external entity, such as an off-chip controller (not shown). These commands can include a preset command, a write command and a read command, among others. In a non-limiting example, a preset command received from the external entity can indicate that the data in the main memory unit 12 should be considered as being "stale", "mask-worthy" (i.e., requiring application of a mask), "not valid", etc. Thereafter, a write command may be received from the external entity with the intention of writing data to a particular cell or group of cells in the main memory unit 12, starting at a start address. In order to track the status (for example, valid or not valid, fresh or stale, mask-worthy or not mask-worthy, etc.) of the main memory unit cells, a set of one or more main memory unit cells is associated with a corresponding cell in the auxiliary memory unit 404. The auxiliary memory unit cells can then each represent a single bit of information indicative of the particular status (e.g., valid or not valid, fresh or stale, mask-worthy or not mask-worthy, etc.) of a corresponding set of, say, three (3) main memory unit cells. Thus, it will be appreciated that at a given point in time, the external entity can establish the status of different cells in the main memory unit 12 by reading from the auxiliary memory unit 404. It is to be understood that the number of main memory unit 12 cells in each set represented by a given one of the auxiliary memory unit cells is not limited to three (3) or any other specific value.

In response to receipt of the preset command, control logic circuitry 470 performs a preset operation on the auxiliary memory unit 404. The aim of the preset operation is to cause each of the cells in the auxiliary memory unit 404 to acquire a particular logic state (e.g., logic "1") that is indicative of the corresponding set of cells in the main memory unit 12 having a first particular status (for example, "not valid", "stale", "mask-worthy", etc.). To this end, the control logic circuitry 470 identifies a first row of the auxiliary memory unit 404 to row decoder circuitry 446, thereby resulting in the selection of a particular one of the wordlines 442 corresponding to the identified row. The control logic circuitry 470 then controls bitline control circuitry 448 so as to set each auxiliary memory unit cell connected to the particular wordline to the particular logic state (in this case, logic "1"). In an example, the bitlines 444 can be controlled by the control logic circuitry 470 in a column-by-column fashion, or several columns at a time, or all simultaneously. This is then repeated for all the rows of the auxiliary memory unit 404 until all the cells in the auxiliary memory unit 404 have acquired the particular logic state (in this case, logic "1") indicative of the cells in the main memory unit 12 having the first particular status (e.g., "not valid", "stale", "mask-worthy", etc.). At this point, the preset operation is said to be complete. It is noted that because N2<N1 and M2>M1/Z, there are fewer rows of the auxiliary memory unit 404 to go through during the preset operation, which can accelerate the preset operation.

At this stage, the writing of input data to the main memory unit 12 can proceed. To this end, the control logic circuitry 470 processes a write command which can identify a start address in the main memory unit 12 and can contain data to be written, starting at the start address. The start address is represented by a particular cell located at a particular row and a particular column in the main memory unit 12, and is thus associated with a particular wordline and a particular pair of bitlines. The control logic circuitry 470 identifies the particular row to row decoder circuitry 126. The control logic circuitry 470 then controls bitline control circuitry 128 so that the particular pair of bitlines will set the particular main memory unit cell to a logic state that corresponds to the value of the input data being written to the start address. Additional control of the bitlines 124 and the wordlines 122 is carried out for other main memory unit cells being subsequently written to.

In order to record the change in status of these main memory unit cells, the control logic circuitry 470 ensures that the contents of the auxiliary memory unit cells that correspond to the main memory unit cells that were written to are toggled to a logic state (e.g., logic "0") that is indicative of data having the second particular status (rather than the first particular status acquired previously). To this end, the control logic circuitry 470 determines the specific row and specific column of the auxiliary memory unit cell whose corresponding set of main memory unit cells includes the particular cell at the start address mentioned above. The control logic circuitry 470 identifies the specific row to row decoder circuitry 446, resulting in selection of a specific one of the wordlines 442 in the auxiliary memory unit 404. The control logic circuitry 470 then controls bitline control circuitry 448 so that a specific pair of bitlines corresponding to the specific column will set to logic "0" the auxiliary memory unit cell whose corresponding set of main memory unit cells includes the particular cell at the start address. The change in status of this corresponding set of main memory unit cells is thus recorded, and the process is repeated for other auxiliary memory unit cells for which the corresponding sets of cells in the main memory unit were also written to.

It should be appreciated that the control logic circuitry 470 can combine the cells in the auxiliary memory unit 404 with the cells 120 in the main memory unit 12 in any desired way. For example, a masking operation may be performed so as to individually logically combine (e.g., in an AND operation, an OR operation, an XOR operation, etc.) the logic value of each of the cells in the auxiliary memory unit 404 with the logic value of each of the cells 120 in the associated set of cells in the main memory unit 12, resulting in a new set of logic values. In such a way, the cells 404 in the auxiliary memory unit 404 can be used as a mask for sets of cells 120 in the main memory unit 12. Such a masking operation may be useful when transferring information to a virtual page buffer in a non-volatile memory device, so as to prevent unwanted writing of memory elements in the non-volatile memory device.

Figure 5:
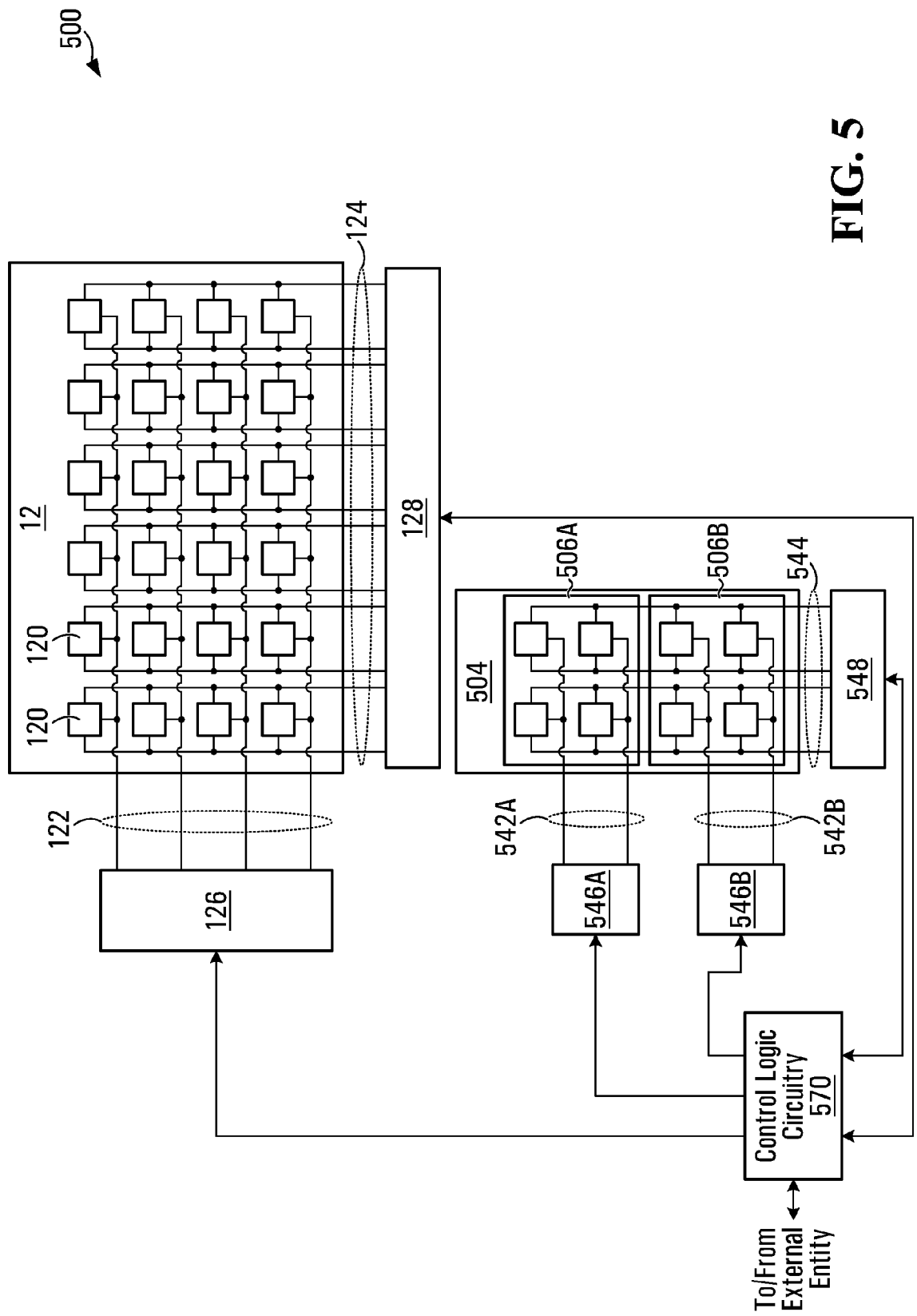
Figure 8D:
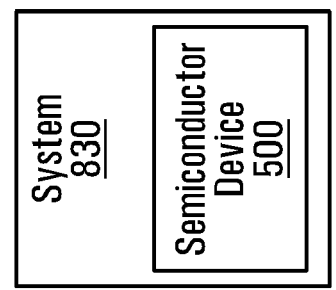

In accordance with another specific non-limiting embodiment, the auxiliary memory unit includes plural sub-units that can be independently controlled. In particular, with reference to FIG. 5, there is shown a semiconductor device 500 with the aforementioned main memory unit 12 and an auxiliary memory unit 504. With reference to FIG. 8D, in accordance with specific non-limiting embodiments of the present invention, the semiconductor device 500 can be embedded in a system 830. The system 830 may be, for example, an ASIC (application-specific integrated circuit) or a SoC (system on chip), to name a few non-limiting possibilities.

The main memory unit 12 has four (4) rows of six (6) columns of cells, while the auxiliary memory unit 504 includes two sub-units 506A, 506B, each with two (2) rows of two (2) columns of cells. It is to be understood, however, that there may be a greater number of sub-units and they need not all have the same dimensions. Also for illustrative purposes, each cell in each of the sub-units 506A, 506B is associated with a set of three (3) cells in the main memory unit 12. In other examples, one bit's worth of information in the auxiliary memory unit 504 represents status information (such as, for example, validity, freshness, mask-worthiness, etc.) for one byte's worth of information in the main memory unit 12. However, it is to be understood that there is no particular limitation on the number of rows or columns or on the number of main memory unit cells in a set that is associated with individual cells of the sub-units 506A, 506B.

The semiconductor device 500 further comprises the aforementioned plurality of wordlines 122, each connected to a respective row of the cells of the main memory unit 12. Row decoder circuitry 126 is provided for control of the wordlines 122. Specifically, when a particular main memory unit cell is to be read from or written to, the wordline connected to the row in which that particular main memory unit cell is located is selected by row decoder circuitry 126. The identity of the row containing cells to be read from or written to is provided by control logic circuitry 570.

The semiconductor device 500 also comprises the aforementioned plurality of bitlines 124 each connected to a respective column of the cells of the main memory unit 12. It is remarked that when single-port cells of the type shown in FIG. 2 are used in the main memory unit 12, two of the bitlines 124 are connected to each column. Bitline control circuitry 128 is provided for control of the bitlines 124. Operation of bitline control circuitry 128 differs depending on whether a read or write operation is being performed. For a write operation, bitline control circuitry 128 is configured to drive the bitlines 124 connected to a selected column of the main memory unit 12 so that each cell in that column which is connected to a wordline that has been selected can be written to, i.e., set to a desired logic state (e.g., logic "0" or logic "1"). It should be appreciated that plural columns of the main memory unit 12 may be selected either simultaneously or in sequence. The identity of the selected column or columns, as well as the value of the data to be written, is provided by the control logic circuitry 570. A column or columns of the main memory unit 12 are similarly identified by the control logic circuitry 570 during a read operation.

The semiconductor device 500 further comprises a plurality of wordlines 542A, each connected to a respective row of the cells of sub-unit 506A. Row decoder circuitry 546A is provided for control of the wordlines 542A. Specifically, when a particular auxiliary memory unit cell in sub-unit 506A is to be read from or written to, the wordline connected to the row in which that particular auxiliary memory unit cell is located is selected by row decoder circuitry 546A. Row decoder circuitry 546A is operable to select an individual wordline among the plurality of wordlines 542A.

Analogously, the semiconductor device 500 further comprises a plurality of wordlines 542B, each connected to a respective row of the cells of sub-unit 506B. Row decoder circuitry 546B is provided for control of the wordlines 542B. Specifically, when a particular auxiliary memory unit cell in sub-unit 506B is to be read from or written to, the wordline connected to the row in which that particular auxiliary memory unit cell is located is selected by row decoder circuitry 546B. Row decoder circuitry 546B is operable to select an individual wordline among the plurality of wordlines 542B.

The semiconductor device 500 further comprises a plurality of bitlines 544 each connected to a respective column of the cells of sub-unit 506A. In accordance with this non-limiting embodiment, each of the bitlines 544 is also connected to a respective column of the cells of sub-unit 506A. It is remarked that when single-port cells of the type shown in FIG. 2 are used in the auxiliary memory unit 504, two of the bitlines 544 are connected to each of two columns of cells, one in sub-unit 506A and its counterpart in sub-unit 506B. Thus, it can be said that the bitlines 544 span plural sub-units. Bitline control circuitry 548 is provided for control of the bitlines 544. Operation of bitline control circuitry 548 differs depending on whether a read or write operation is being performed. For a write operation, bitline control circuitry 548 is configured to drive the bitlines 544 connected to a selected column of the sub-unit 506A (and its counterpart column in sub-unit 506B) so that each cell in those columns which is connected to a wordline that has been selected can be written to, i.e., set to a desired logic state (e.g., logic "0" or logic "1"). It should be appreciated that plural columns of sub-unit 506A may be selected either simultaneously or in sequence, while their counterpart columns in sub-unit 506B are also jointly selected. The identity of the selected column or columns in sub-unit 506A (and its counterpart column or columns in sub-unit 506B), as well as the value of the data to be written, is provided by the control logic circuitry 570. A column or columns of sub-unit 506A (and its counterpart column or columns in sub-unit 506B) are similarly identified by the control logic circuitry 570 during a read operation.

In operation, control logic circuitry 570 processes commands received from an external entity, such as an off-chip controller (not shown). These commands can include a preset command, a write command and a read command, among others. In a non-limiting example, a preset command received from the external entity can indicate that the data in the main memory unit 12 should be considered as being "stale", "mask-worthy" (i.e., requiring application of a mask), "not valid", etc. Thereafter, a write command may be received from the external entity with the intention of writing data to a particular cell or group of cells in the main memory unit 12, starting at a start address. In order to track the status (for example, valid or not valid, fresh or stale, mask-worthy or not mask-worthy, etc.) of the main memory unit cells, a set of one or more main memory unit cells is associated with a corresponding cell in one of the sub-units 506A, 506B of the auxiliary memory unit 504. The auxiliary memory unit cells can then each represent a single bit of information indicative of the particular status (e.g., valid or not valid, fresh or stale, mask-worthy or not mask-worthy, etc.) of a corresponding set of, say, three (3) main memory unit cells. Thus, it will be appreciated that at a given point in time, the external entity can establish the status of different cells in the main memory unit 12 by reading from the auxiliary memory unit 504. It is to be understood that the number of main memory unit 12 cells in each set represented by a given one of the auxiliary memory unit cells is not limited to three (3) or any other specific value.

In response to receipt of the preset command, control logic circuitry 570 performs a preset operation on the auxiliary memory unit 504. The aim of the preset operation is to cause each of the cells in the sub-units 506A, 506B to acquire a particular logic state (e.g., logic "1") that is indicative of the corresponding set of cells in the main memory unit 12 having a first particular status (for example, "not valid", "stale", "mask-worthy", etc.). To this end, the control logic circuitry 570 identifies a first row of sub-unit 506A to row decoder circuitry 546A and a first row of sub-unit 506B to row decoder circuitry 546B, thereby resulting in the selection of a pair of wordlines, one each among the wordlines 542A and the wordlines 542B. The control logic circuitry 570 then controls bitline control circuitry 548 so as to simultaneously set each auxiliary memory unit cell connected to the particular pair of wordlines to the particular logic state (in this case, logic "1"). In an example, the bitlines 544 can be controlled by the control logic circuitry 570 in a column-by-column fashion, or several columns at a time, or all simultaneously. This is then repeated for another pair of rows in the sub-units 506A, 506B, and so on, until all the cells in the auxiliary memory unit 504 have acquired the particular logic state (in this case, logic "1") indicative of the cells in the main memory unit 12 having the first particular status (e.g., "not valid", "stale", "mask-worthy", etc.). At this point, the preset operation is said to be complete.

At this stage, the writing of input data to the main memory unit 12 can proceed. To this end, the control logic circuitry 570 processes a write command which can identify a start address in the main memory unit 12 and can contain data to be written, starting at the start address. The start address is represented by a particular cell located at a particular row and a particular column in the main memory unit 12, and is thus associated with a particular wordline and a particular pair of bitlines. The control logic circuitry 570 identifies the particular row to row decoder circuitry 126. The control logic circuitry 570 then controls bitline control circuitry 128 so that the particular pair of bitlines will set the particular main memory unit cell to a logic state that corresponds to the value of the input data being written to the start address. Additional control of the bitlines 124 and the wordlines 122 is carried out for other main memory unit cells being subsequently written to.

In order to record the change in status of these main memory unit cells, the control logic circuitry 570 ensures that the contents of the auxiliary memory unit cells that correspond to the main memory unit cells that were written to are toggled to a logic state (e.g., logic "0") that is indicative of data having a second particular status (rather than the first particular status acquired previously). To this end, the control logic circuitry 570 determines the specific sub-unit, the specific row and the specific column of the auxiliary memory unit cell whose corresponding set of main memory unit cells includes the particular cell at the start address mentioned above. If the specific sub-unit is sub-unit 506A, the control logic circuitry 570 identifies the specific row to row decoder circuitry 546A, resulting in selection of a specific one of the wordlines 542A in sub-unit 506A. Analogously, if the specific sub-unit is sub-unit 506B, the control logic circuitry 570 identifies the specific row to row decoder circuitry 546B, resulting in selection of a specific one of the wordlines 542B in sub-unit 506B. The control logic circuitry 570 then controls bitline control circuitry 548 so that a specific pair of bitlines corresponding to the specific column will set to logic "0" the auxiliary memory unit cell whose corresponding set of main memory unit cells includes the particular cell at the start address. The change in status of this corresponding set of main memory unit cells is thus recorded, and the process is repeated for other auxiliary memory unit cells for which the corresponding sets of cells in the main memory unit were also written to with valid data.

It should be appreciated that the control logic circuitry 570 can combine the cells in the auxiliary memory unit 504 with the cells 120 in the main memory unit 12 in any desired way. For example, a masking operation may be performed so as to individually logically combine (e.g., in an AND operation, an OR operation, an XOR operation, etc.) the logic value of each of the cells in the auxiliary memory unit 504 with the logic value of each of the cells 120 in the associated set of cells in the main memory unit 12, resulting in a new set of logic values. In such a way, the cells in the auxiliary memory unit 504 can be used as a mask for sets of cells 120 in the main memory unit 12. Such a masking operation may be useful when transferring information to a virtual page buffer in a non-volatile memory device, so as to prevent unwanted writing of memory elements in the non-volatile memory device.

Figure 7:
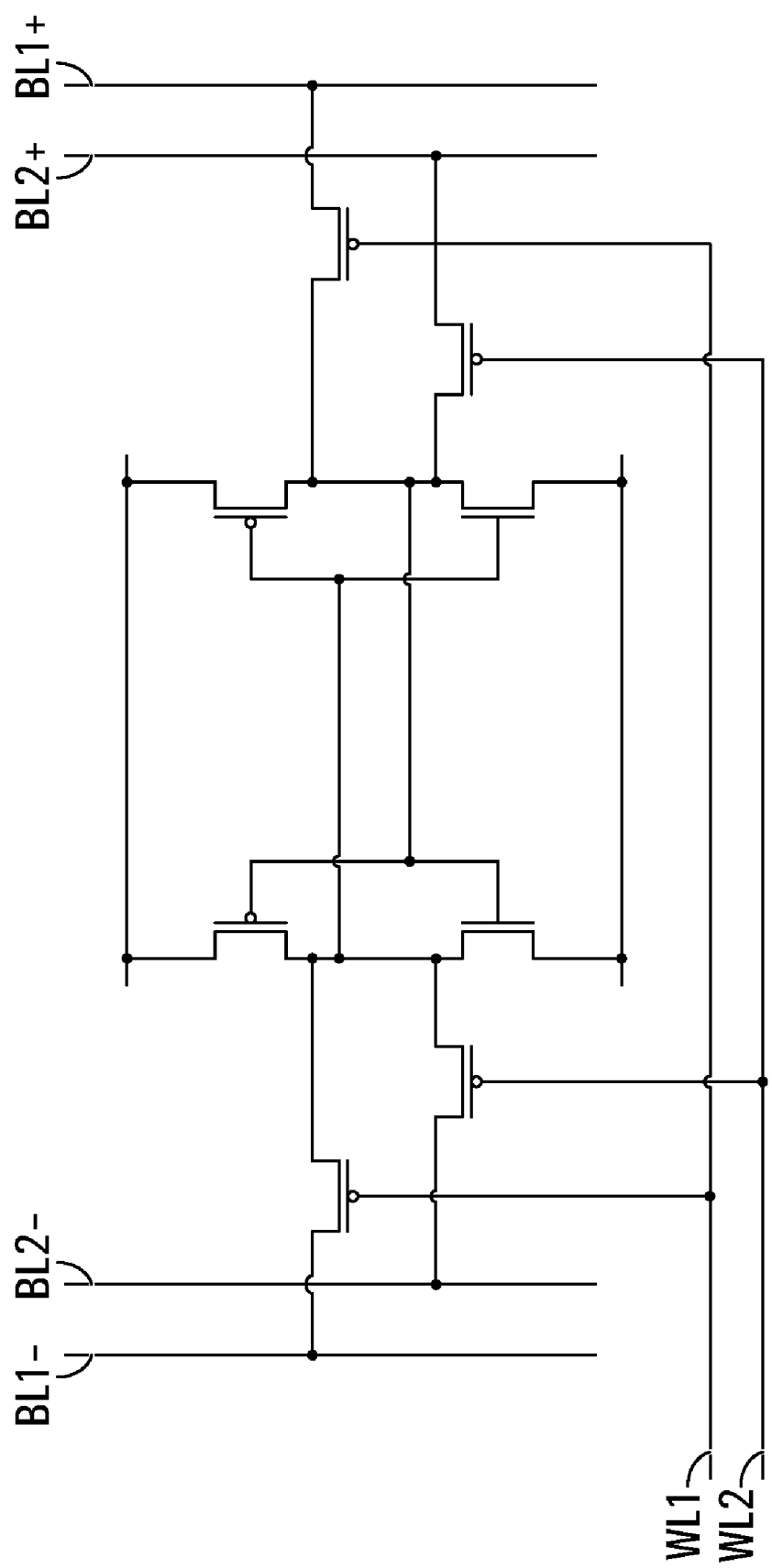
FIG. 7 is a circuit diagram of a dual-port SRAM memory cell.

In accordance with another specific non-limiting embodiment, the auxiliary memory unit utilizes dual-port SRAM cells while the main memory unit utilizes single-port SRAM cells. With reference to FIG. 7, there is shown a dual-port SRAM cell, which bears some similarity to the single-port SRAM cell of FIG. 2 but includes two transistors in lieu of transistor 230 in FIG. 2 and two other transistors in lieu of transistor 235 in FIG. 2. Also, the dual-port SRAM cell includes two wordlines, namely an A-wordline WL1 and a B-wordline WL2. Further, the dual-port SRAM cell includes two pairs of bitlines, namely an A-pair of bitlines BL1−, BL1+ and a B-pair of bitlines BL2−, BL2+.

The dual-port SRAM cell can be read from or written to by controlling the A-wordline WL1 and the A-pair of bitlines BL1−, BL1+, or by controlling the B-wordline WL2 and the B-pair of bitlines BL2−, BL2+. The A-wordline WL1 is set to high (i.e., "selected" or "asserted") for both read and write operations. For a read operation, both A-pair bitlines BL1+, BL1− are sensed after they have been precharged to a high level. A high value on one of the A-pair of bitlines BL1+, BL1− does not change the value in the cell, instead the cell will pull one of the A-pair of bitlines BL1+, BL1− low. Depending on which of the A-pair of bitlines BL1+, BL1− is pulled low, this will be interpreted as either a logic "0" or a logic "1". For a write operation, one of the A-pair of bitlines BL1+, BL1− is forced low, and the other is forced high. The low value overpowers the PMOS transistor connected to the bitline that was forced low, which results in the cell being written to. Depending on which of the A-pair of bitlines BL1+, BL1− was forced low, this will write either a logic "0" or a logic "1" to the cell.

Similarly, the B-wordline WL2 is set to high (i.e., "selected" or "asserted") for both read and write operations. For a read operation, both B-pair bitlines BL2+, BL2− are sensed after they have been precharged to a high level. A high value on one of the B-pair of bitlines BL2+, BL2− does not change the value in the cell, instead the cell will pull one of the B-pair of bitlines BL2+, BL2− low. Depending on which of the B-pair of bitlines BL2+, BL2− is pulled low, this will be interpreted as either a logic "0" or a logic "1". For a write operation, one of the B-pair of bitlines BL2+, BL2− is forced low, and the other is forced high. The low value overpowers the PMOS transistor connected to the bitline that was forced low, which results in the cell being written to. Depending on which of the B-pair of bitlines BL2+, BL2− was forced low, this will write either a logic "0" or a logic "1" to the cell.

Figure 6:
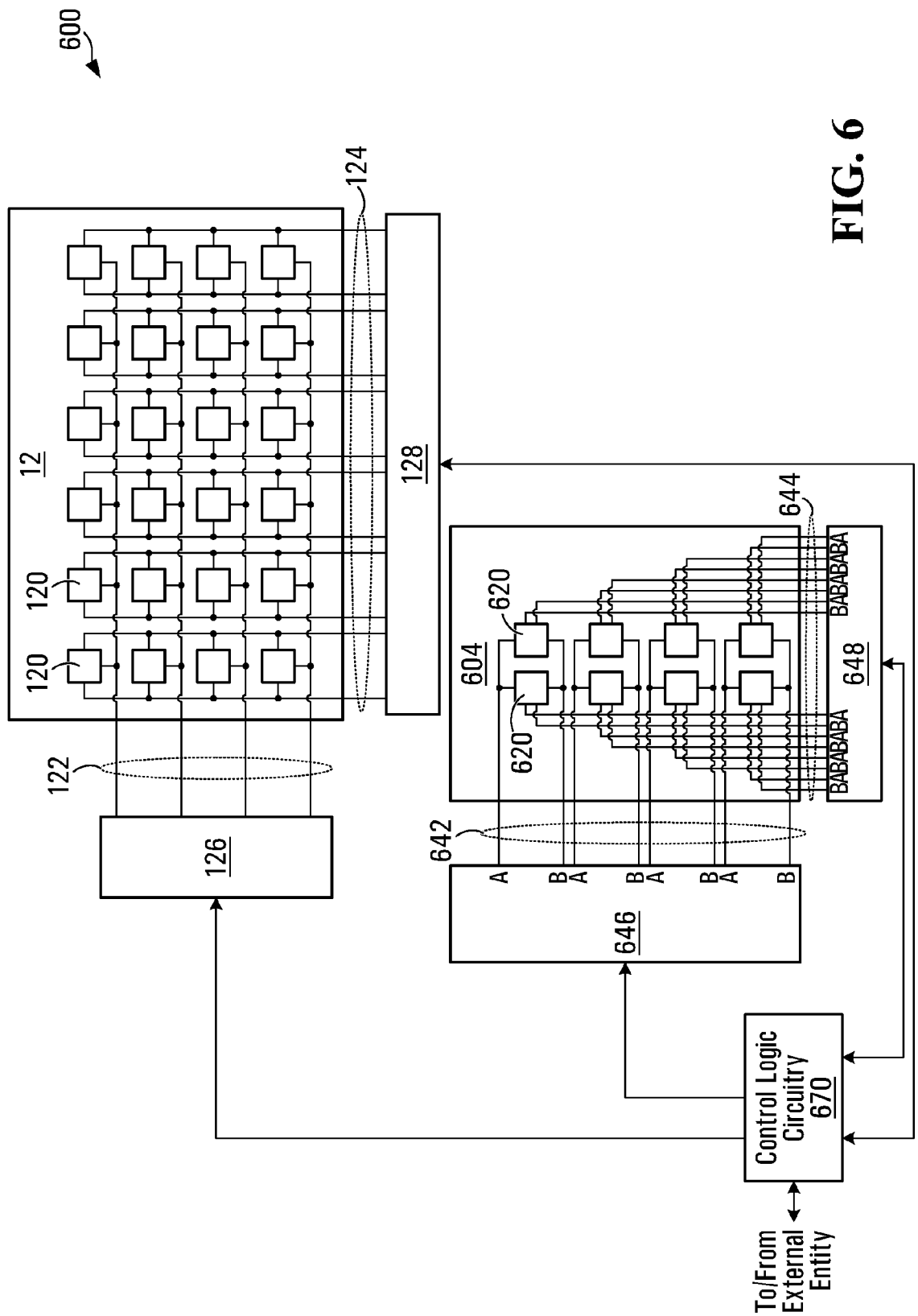
Figure 8E:
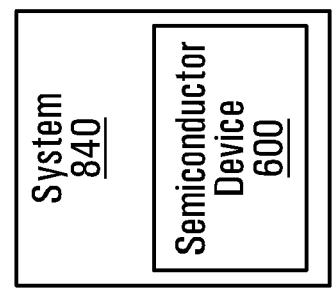

Turning now to FIG. 6, there is shown a semiconductor device 600 with the aforementioned main memory unit 12 and an auxiliary memory unit 604 that uses dual-port SRAM cells. With reference to FIG. 8E, in accordance with specific non-limiting embodiments of the present invention, the semiconductor device 600 can be embedded in a system 840. The system 840 may be, for example, an ASIC (application-specific integrated circuit) or a SoC (system on chip), to name a few non-limiting possibilities.

The main memory unit 12 has four (4) rows of six (6) columns of cells 120, the auxiliary memory unit 604 includes two four (4) rows of two (2) columns of cells 620 and each cell in the auxiliary memory unit 604 is associated with a set of three (3) cells in the main memory unit 12. In other examples, one bit's worth of information in the auxiliary memory unit 604 represents status information (such as, for example, validity, freshness, mask-worthiness, etc.) for one byte's worth of information in the main memory unit 12. However, it is to be understood that there is no particular limitation on the number of rows or columns or on the number of main memory unit cells in a set that is associated with individual cells of the auxiliary memory unit 604.

The semiconductor device 600 further comprises the aforementioned plurality of wordlines 122, each connected to a respective row of the cells of the main memory unit 12. Row decoder circuitry 126 is provided for control of the wordlines 122. Specifically, when a particular main memory unit cell is to be read from or written to, the wordline connected to the row in which that particular main memory unit cell is located is selected by row decoder circuitry 126. The identity of the row containing cells to be read from or written to is provided by control logic circuitry 670.

The semiconductor device 600 also comprises the aforementioned plurality of bitlines 124 each connected to a respective column of the cells of the main memory unit 12. It is remarked that when single-port cells of the type shown in FIG. 2 are used in the main memory unit 12, two of the bitlines 124 are connected to each column. Bitline control circuitry 128 is provided for control of the bitlines 124. Operation of bitline control circuitry 128 differs depending on whether a read or write operation is being performed. For a write operation, bitline control circuitry 128 is configured to drive the bitlines 124 connected to a selected column of the main memory unit 12 so that each cell in that column which is connected to a wordline that has been selected can be written to, i.e., set to a desired logic state (e.g., logic "0" or logic "1"). It should be appreciated that plural columns of the main memory unit 12 may be selected either simultaneously or in sequence. The identity of the selected column or columns, as well as the value of the data to be written, is provided by the control logic circuitry 670. A column or columns of the main memory unit 12 are similarly identified by the control logic circuitry 670 during a read operation.

The semiconductor device 600 further comprises a plurality of wordlines 642. It is remarked that when dual-port cells of the type shown in FIG. 7 are used in the auxiliary memory unit 604, the wordlines 642 are connected in pairs to respective rows of the cells 620 of the auxiliary memory unit 604. Thus, a first pair of wordlines 642 is connected to a first row of cells of the auxiliary memory unit 604, a second pair of wordlines 642 is connected to a second row, and so on. Within each pair of wordlines, one can identify an A-wordline and a B-wordline. Row decoder circuitry 646 is provided for control of the wordlines 642, including the A-wordline and the B-wordline for each row. Specifically, when a particular auxiliary memory unit cell is to be read from or written to, the A-wordline or the B-wordline for the row in which that particular auxiliary memory unit cell is located is selected by row decoder circuitry 646. Row decoder circuitry 646 is operable to select one A-wordline and one B-wordline, which may, but need not, both be in the same row. Thus, the row decoder circuitry 646 can effectively select two different rows, which allows cells on two separate rows to be read from or written to, or allows cells on one row to be read from while cells on another row are written to.

The semiconductor device 600 further comprises a plurality of bitlines 644 each connected to a respective column of the cells of the auxiliary memory unit 604. It is remarked that when dual-port cells of the type shown in FIG. 7 are used in the auxiliary memory unit 604, each of the auxiliary memory unit cells 620 is connected to two pairs of the bitlines 644, including an A-pair of bitlines and a B-pair of bitlines. Bitline control circuitry 648 is provided for control of the bitlines 644, including the A-pairs of bitlines and the B-pairs of bitlines. The A-pair of bitlines connected to a given cell is associated with the A-wordline for the row in which the given cell is located. Analogously, the B-pair of bitlines connected to a given cell is associated with the B-wordline for the row in which the given cell is located. Control by the bitline control circuitry 648 of the A-pair of bitlines for a given cell while the A-wordline is selected allows reading or writing to the given cell. Analogously, control by the bitline control circuitry 648 of the B-pair of bitlines for a given cell while the B-wordline is selected allows reading or writing to the given cell.

Thus, two rows can be selected, one via the A-wordline and one via the B-wordline, and the cells in those rows can be independently read from or written to using the A-pair of bitlines and the B-pair of bitlines, respectively. Specifically, given two selected cells in different rows, the first selected cell can be read from or written to without impacting the other cells in that same row and that happen to be in the same column as the second selected cell, which is in a different row. This allows the cells in different rows to be written to independently, e.g., the cells in one row can be written to from left to right, while at the same time the cells in the other row can be written to from right to left. While this example has assumed that only one cell in each row is to be written to simultaneously, it should be understood that control of the bitlines 648 allows multiple cells in each row to be written to simultaneously. Thus, for example, groups of cells in one row can be written to from left to right, while at the same time groups of cells in another row can be written to from right to left.

The identity of the columns containing the cells to be written to, as well as the value of the actual data to be written, is provided to the bitline control circuitry 648 by the control logic circuitry 670. During a read operation involving one or more columns of the auxiliary memory unit 604, these are similarly identified by the control logic circuitry 670.

In operation, control logic circuitry 670 processes commands received from an external entity, such as an off-chip controller (not shown). These commands can include a preset command, a write command and a read command, among others. In a non-limiting example, a preset command received from the external entity can indicate that the data in the main memory unit 12 should be considered as being "stale", "mask-worthy" (i.e., requiring application of a mask), "not valid", etc. Thereafter, a write command may be received from the external entity with the intention of writing data to a particular cell or group of cells in the main memory unit 12, starting at a start address. In order to track the status (for example, valid or not valid, fresh or stale, mask-worthy or not mask-worthy, etc.) of the main memory unit cells, a set of one or more main memory unit cells is associated with a corresponding cell in the auxiliary memory unit 604. The auxiliary memory unit cells can then each represent a single bit of information indicative of the particular status (e.g., valid or not valid, fresh or stale, mask-worthy or not mask-worthy, etc.) of a corresponding set of, say, three (3) main memory unit cells. Thus, it will be appreciated that at a given point in time, the external entity can establish the status of different cells in the main memory unit 12 by reading from the auxiliary memory unit 604. It is to be understood that the number of main memory unit 12 cells in each set represented by a given one of the auxiliary memory unit cells is not limited to three (3) or any other specific value.

In response to receipt of the preset command, control logic circuitry 670 performs a preset operation on the auxiliary memory unit 604. The aim of the preset operation is to cause each of the cells in the auxiliary memory unit 604 to acquire a particular logic state (e.g., logic "1") that is indicative of the corresponding set of cells in the main memory unit 12 having a first particular status (for example, "not valid", "stale", "mask-worthy", etc.). To this end, the control logic circuitry 670 identifies a first row and a second row of the auxiliary memory unit 604 to row decoder circuitry 646, thereby resulting in the selection of the first row's A-wordline and the second row's B-wordline. The control logic circuitry 670 then controls bitline control circuitry 648 so as to set the auxiliary memory unit cells connected to the selected A-wordline and the selected B-wordline to the particular logic state (in this case, logic "1"). Specifically, the bitline control circuitry 648 controls the A-pairs of bitlines in order to write to the cells in the first row and also controls the B-pairs of bitlines in order to write to the cells in the second row. Once all the cells in the auxiliary memory unit 604 have acquired the particular logic state (in this case, logic "1") indicative of the cells in the main memory unit 12 having the first particular status (e.g., "not valid", "stale", "mask-worthy", etc.), the preset operation is said to be complete.

At this stage, the writing of input data to the main memory unit 12 can proceed. To this end, the control logic circuitry 670 processes a write command which can identify a start address in the main memory unit 12 and can contain data to be written, starting at the start address. The start address is represented by a particular cell located at a particular row and a particular column in the main memory unit 12, and is thus associated with a particular wordline and a particular pair of bitlines. The control logic circuitry 670 identifies the particular row to row decoder circuitry 126. The control logic circuitry 670 then controls bitline control circuitry 128 so that the particular pair of bitlines will set the particular main memory unit cell to a logic state that corresponds to the value of the input data being written to the start address. Additional control of the bitlines 124 and the wordlines 122 is carried out for other main memory unit cells being subsequently written to.

In order to record the change in status of these main memory unit cells, the control logic circuitry 670 ensures that the contents of the auxiliary memory unit cells that correspond to the main memory unit cells that were written to are toggled to a logic state (e.g., logic "0") that is indicative of data having a second particular status (rather than the first particular status acquired previously). To this end, the control logic circuitry 670 determines the specific row and the specific column of the auxiliary memory unit cell whose corresponding set of main memory unit cells includes the particular cell at the start address mentioned above. The control logic circuitry 670 then identifies the specific row to row decoder circuitry 646, resulting in selection of that row's A-wordline (or B-wordline). The control logic circuitry 670 then controls bitline control circuitry 648 so that the A-pair (or B-pair) of bitlines corresponding to the specific column will set to logic "0" the auxiliary memory unit cell whose corresponding set of main memory unit cells includes the particular cell at the start address. The change in status of this corresponding set of main memory unit cells is thus recorded, and the process is repeated for other auxiliary memory unit cells for which the corresponding sets of cells in the main memory unit were also written to.

It should be appreciated that the control logic circuitry 670 can combine the cells in the auxiliary memory unit 604 with the cells 120 in the main memory unit 12 in any desired way. For example, a masking operation may be performed so as to individually logically combine (e.g., in an AND operation, an OR operation, an XOR operation, etc.) the logic value of each of the cells in the auxiliary memory unit 604 with the logic value of each of the cells 120 in the associated set of cells in the main memory unit 12, resulting in a new set of logic values. In such a way, the cells in the auxiliary memory unit 604 can be used as a mask for sets of cells 120 in the main memory unit 12. Such a masking operation may be useful when transferring information to a virtual page buffer in a non-volatile memory device, so as to prevent unwanted writing of memory elements in the non-volatile memory device.

It should also be appreciated that in some embodiments, all or part of the main memory unit and/or the auxiliary memory unit in each embodiment can be manufactured based on a low-level hardware description obtained using a logic synthesis tool that is run on a computing device. The logic synthesis tool is configured to read source code containing a functional description of the main memory unit and/or the auxiliary memory unit (e.g., in a language such as HDL, VHDL, Verilog) and to output a definition of the physical implementation of a circuit suitable for implementing corresponding functionality.

In the examples described above, the device, elements and circuits are connected to each other as shown in the figures, for the sake of simplicity. In practical applications of the present invention, elements, circuits, etc. may be connected directly to each other. As well, elements, circuits etc. may be connected indirectly to each other through other elements, circuits, etc., necessary for operation of the devices or apparatus. Thus, in actual configuration, the devices, elements and circuits are directly or indirectly coupled with or connected to each other.

Certain adaptations and modifications of the described embodiments can be made. Therefore, the above discussed embodiments are to be considered illustrative and not restrictive.

What is claimed is:

1. A semiconductor device, comprising:
a main memory unit including a plurality of main cells;
an auxiliary memory unit including a plurality of auxiliary cells arranged into rows and columns, each of the auxiliary cells corresponding to a respective set of the main cells;
a plurality of wordlines each connected to a respective row of the auxiliary cells;
a plurality of bitlines each connected to a respective column of the auxiliary cells;
row decoder circuitry for selecting, in a first mode of operation, an individual wordline among the plurality of wordlines and, in a second mode of operation, a group of wordlines within the plurality of wordlines;
bitline control circuitry for driving the bitlines to enable writing of auxiliary cells connected to a wordline that has been selected;
control logic circuitry for (i) controlling the bitline control circuitry while the row decoder circuitry operates in the second mode of operation so as to set each of the auxiliary cells to a first logic state; (ii) causing input data to be written to selected ones of the main cells; and (iii) controlling the bitline control circuitry while the row decoder circuitry operates in the first mode of operation so as to set those auxiliary cells corresponding to the selected ones of the main cells to a second logic state different from the first logic state.

2. The semiconductor device defined in claim 1, wherein the control logic circuitry is configured to place the row decoder circuitry in the second mode of operation upon receipt of a command from an external entity.

3. The semiconductor device defined in claim 2, wherein the external entity comprises an off-chip controller and wherein the command comprises a preset command.

4. The semiconductor device defined in claim 2, wherein to place the row decoder circuitry in the second mode of operation, the control logic circuitry is configured to command the row decoder circuitry to select the group of wordlines.

5. The semiconductor device defined in claim 4, wherein the group of wordlines includes all of the wordlines.

6. The semiconductor device defined in claim 5, wherein the group of wordlines is selectable from among a plurality of wordline combinations, each wordline combination including less than all of the wordlines.

7. The semiconductor device defined in claim 1, wherein the control logic circuitry is configured to cause the input data to be written to the selected ones of the main cells upon receipt of a command from an external entity.

8. The semiconductor device defined in claim 7, wherein the external entity comprises an off-chip controller and wherein the command comprises a write command identifying a start address from which the selected ones of the main cells can be determined.

9. The semiconductor device defined in claim 7, wherein the control logic circuitry is configured to place the row decoder circuitry in the first mode of operation upon completion of writing of the input data.

10. The semiconductor device defined in claim 9, wherein to place the row decoder circuitry in the first mode of operation, the control logic circuitry is configured to command the row decoder circuitry to select an individual wordline whose connected-to row contains at least one main cell that was written to.

11. The semiconductor device defined in claim 1, wherein controlling the bitline control circuitry while the row decoder circuitry operates in the second mode of operation comprises (i) selecting a column of the auxiliary cells; (ii) setting to the first logic state each auxiliary cell in the selected column and that is connected to a wordline that has been selected; and (iii) repeating the selecting and the setting for each of the other columns of the auxiliary cells.

12. The semiconductor device defined in claim 1, wherein controlling the bitline control circuitry while the row decoder circuitry operates in the second mode of operation comprises (i) selecting a plurality of the columns of the auxiliary cells; (ii) simultaneously setting to the first logic state those auxiliary cells in the selected columns that are connected to a wordline that has been selected; and (iii) repeating the selecting and the simultaneously setting for multiple other pluralities of the columns of the auxiliary cells.

13. The semiconductor device defined in claim 1, wherein controlling the bitline control circuitry while the row decoder circuitry operates in the second mode of operation comprises simultaneously setting to the first logic state all auxiliary cells connected to a wordline that has been selected.

14. The semiconductor device defined in claim 1, wherein the bitlines are first bitlines, wherein each of the wordlines connected to a given row of the auxiliary cells is also connected to a respective row of the main cells that includes the set or sets of main cells corresponding to the auxiliary cells in the given row of the auxiliary cells, wherein the main cells are arranged into rows and columns, and wherein the semiconductor device further includes:
   a plurality of second bitlines each connected to a respective column of the main cells;
   wherein the bitline control circuitry is further for driving the second bitlines to enable writing of auxiliary cells connected to a wordline that has been selected;
   wherein the control logic circuitry causes the input data to be written to the selected ones of the main cells by controlling the bitline control circuitry while the row decoder circuitry is the first mode of operation.

15. The semiconductor device defined in claim 14, wherein the control logic circuitry is configured to place the row decoder circuitry in the first mode of operation upon receipt of a command from an external entity.

16. The semiconductor device defined in claim 15, wherein the external entity comprises an off-chip controller and wherein the command comprises a write command identifying a start address from which the selected ones of the main cells can be determined.

17. The semiconductor device defined in claim 15, wherein to place the row decoder circuitry in the first mode of operation, the control logic circuitry is configured to command the row decoder circuitry to select an individual wordline whose connected-to row contains at least one main cell to be written to.

18. The semiconductor device defined in claim 16, wherein to place the row decoder circuitry in the first mode of operation, the control logic circuitry is configured to command the row decoder circuitry to select an individual wordline whose connected-to row includes the start address.

19. The semiconductor device defined in claim 1, wherein the wordlines are first wordlines, wherein the bitlines are first bitlines, wherein the bitline control circuitry is first bitline control circuitry, wherein the row decoder circuitry is first row decoder circuitry, wherein the main cells are arranged into rows and columns, and wherein the semiconductor device further comprises:
   a plurality of second wordlines each connected to a respective row of the main cells, the second wordlines being different from the first wordlines;
   second row decoder circuitry for selecting an individual second wordline among the plurality of second wordlines;
   a plurality of second bitlines each connected to a respective column of the main cells;
   second bitline control circuitry for driving the second bitlines to enable writing of main cells connected to a second wordline that has been selected;
   wherein the control logic circuitry causes the input data to be written to the selected ones of the main cells by controlling the second bitline control circuitry and the second row decoder circuitry.

20. The semiconductor device defined in claim 19, wherein the control logic circuitry is configured to command the second row decoder circuitry to select an individual second wordline whose connected-to row contains at least one main cell to be written to.

21. The semiconductor device defined in claim 20, wherein the control logic circuitry is configured to command the second row decoder upon receipt of a command from an external entity.

22. The semiconductor device defined in claim 21, wherein the external entity comprises an off-chip controller and wherein the command comprises a write command identifying a start address from which the selected ones of the main cells can be determined.

23. A method for execution by a semiconductor device, comprising:
   selecting a group of rows of auxiliary cells forming part of an auxiliary memory unit, the auxiliary cells being arranged into rows and columns;
   driving a plurality of bitlines each connected to a respective column of the auxiliary cells, so as to set each of the auxiliary cells to a first logic state;
   writing input data to selected ones of a plurality of main cells, wherein each of the auxiliary cells corresponds to a respective set of the main cells;
   selecting a particular row of auxiliary cells that includes at least one auxiliary cell whose corresponding set of main cells includes at least one of the selected cells;
   driving the bitlines so as to set the at least one auxiliary cell to a second logic state different from the first logic state.

24. A semiconductor device, comprising:
   a main memory unit including a plurality of main cells;
   an auxiliary memory unit including a plurality of sub-units, each sub-unit comprising a plurality of auxiliary cells arranged into rows and columns, each of the auxiliary cells corresponding to a respective set of the main cells;
   a plurality of wordlines each connected to a respective row of the auxiliary cells;
   a plurality of bitlines each connected to a respective column of the auxiliary cells and spanning the plurality of sub-units;
   row decoder circuitry for selecting, in a first mode of operation, an individual wordline among the plurality of wordlines of a particular one of the sub-units and, in a second mode of operation, a group of wordlines including at least one wordline from each of at least two of the sub-units;
   bitline control circuitry for driving the bitlines to enable writing of auxiliary cells connected to a wordline that has been selected;
   control logic circuitry for (i) controlling the bitline control circuitry while the row decoder circuitry operates in the second mode of operation so as to set each of the auxiliary cells in each of the sub-units to a first logic state; (ii) causing input data to be written to selected ones of the main cells; and (iii) controlling the bitline control circuitry while the row decoder circuitry operates in the first mode of operation so as to set those auxiliary cells corresponding to the selected ones of the main cells to a second logic state different from the first logic state.

25. The semiconductor device defined in claim 24, wherein the row decoder circuitry comprises a plurality of row decoders, each respectively corresponding to one of the sub-units.

26. The semiconductor device defined in claim 25, wherein each of the row decoders individually selects at least one wordline identified by the control logic circuitry.

27. The semiconductor device defined in claim 26, wherein the control logic circuitry is configured to identify at least one wordline to be selected by each of the row decoders so that the row decoder circuitry is capable of selecting, in the second mode of operation, a group of wordlines including at least one wordline from each of at least two of the sub-units.

28. The semiconductor device defined in claim 27, wherein the group of wordlines includes at least one wordline from each of the sub-units.

29. The semiconductor device defined in claim 27, wherein the group of wordlines includes all of the wordlines from all of the sub-units.

30. The semiconductor device defined in claim 24, wherein the control logic circuitry is configured to cause the input data to be written to the selected ones of the main cells upon receipt of a command from an external entity.

31. The semiconductor device defined in claim 30, wherein the external entity comprises an off-chip controller and wherein the command comprises a write command identifying a start address from which the selected ones of the main cells can be determined.

32. The semiconductor device defined in claim 30, wherein the control logic circuitry is configured to place the row decoder circuitry in the first mode of operation upon completion of writing of the input data.

33. The semiconductor device defined in claim 32, wherein to place the row decoder circuitry in the first mode of operation, the control logic circuitry is configured to command the row decoder circuitry to select an individual wordline whose connected-to row contains at least one main cell that was written to.

34. The semiconductor device defined in claim 24, wherein controlling the bitline control circuitry while the row decoder circuitry operates in the second mode of operation comprises (i) selecting a column of the auxiliary cells; (ii) setting to the first logic state each auxiliary cell in the selected column and that is connected to a wordline that has been selected; and (iii) repeating the selecting and the setting for each of the other columns of the auxiliary cells.

35. The semiconductor device defined in claim 24, wherein controlling the bitline control circuitry while the row decoder circuitry operates in the second mode of operation comprises (i) selecting a plurality of the columns of the auxiliary cells; (ii) simultaneously setting to the first logic state those auxiliary cells in the selected columns that are connected to a wordline that has been selected; and (iii) repeating the selecting and the simultaneously setting for multiple other pluralities of the columns of the auxiliary cells.

36. The semiconductor device defined in claim 24, wherein controlling the bitline control circuitry so as to set each of the auxiliary cells to the first logic state comprises simultaneously setting to the first logic state all auxiliary cells connected to a wordline that has been selected.

37. A method for execution by a semiconductor device, comprising:
    selecting a group of rows of auxiliary cells including at least one row from each of at least two sub-units, the auxiliary cells in each of the sub-units being arranged into rows and columns;
    driving a plurality of bitlines each connected to a respective column of the auxiliary cells and spanning the plurality of sub-units, so as to set each of the auxiliary cells to a first logic state;
    writing input data to selected ones of a plurality of main cells, wherein each of the auxiliary cells corresponds to a respective set of the main cells;
    selecting a particular row of a particular one of the sub-units, the particular row including at least one auxiliary cell whose corresponding set of main cells includes at least one of the selected cells;
    driving the bitlines so as to set the at least one auxiliary cell to a second logic state different from the first logic state.

38. A semiconductor device, comprising:
    a main memory unit including a plurality of main cells arranged into an array of N1 rows and M1 columns;
    an auxiliary memory unit including a plurality of auxiliary cells arranged into N2 rows and M2 columns, each of the auxiliary cells corresponding to a respective set of Z main cells, N2 being less than N1 and M2 being greater than M1/Z;
    a plurality of wordlines each connected to a respective row of the auxiliary cells;
    a plurality of bitlines each connected to a respective column of the auxiliary cells;
    row decoder circuitry for selecting an individual wordline among the plurality of wordlines;
    bitline control circuitry for driving the plurality of bitlines to enable writing of auxiliary cells connected to the selected wordline;
    control logic circuitry for (i) controlling the bitline control circuitry so as to set each of the auxiliary cells to a first logic state; (ii) causing input data to be written to selected ones of the main cells; and (iii) controlling the bitline control circuitry so as to set those auxiliary cells corresponding to the selected ones of the main cells to a second logic state different from the first logic state.

39. The semiconductor device defined in claim 38, wherein the control logic circuitry is configured to set each of the auxiliary cells to the first logic state upon receipt of a command from an external entity.

40. The semiconductor device defined in claim 39, wherein the external entity comprises an off-chip controller and wherein the command comprises a preset command.

41. The semiconductor device defined in claim 38, wherein the control logic circuitry is configured to cause the input data to be written to the selected ones of the main cells upon receipt of a command from an external entity.

42. The semiconductor device defined in claim 41, wherein the external entity comprises an off-chip controller and wherein the command comprises a write command identifying a start address from which the selected ones of the main cells can be determined.

43. The semiconductor device defined in claim 38, wherein controlling the bitline control circuitry so as to set each of the auxiliary cells to the first logic state comprises (i) selecting a column of the auxiliary cells; (ii) setting to the first logic state each auxiliary cell in the selected column and that is connected to a wordline that has been selected; and (iii) repeating the selecting and the setting for each of the other columns of the auxiliary cells.

44. The semiconductor device defined in claim 38, wherein controlling the bitline control circuitry so as to set each of the auxiliary cells to the first logic state comprises (i) selecting a plurality of the columns of the auxiliary cells; (ii) simultaneously setting to the first logic state those auxiliary cells in the selected columns that are connected to a wordline that has been selected; and (iii) repeating the selecting and the simultaneously setting for multiple other pluralities of the columns of the auxiliary cells.

45. The semiconductor device defined in claim 38, wherein controlling the bitline control circuitry so as to set each of the auxiliary cells to the first logic state comprises simultaneously setting to the first logic state all auxiliary cells connected to a wordline that has been selected.

46. A method for execution by a semiconductor device, comprising:
- writing input data to selected ones of a plurality of main cells forming part of a main memory unit, the main cells of the main memory unit being arranged into N1 rows and M1 columns;
- prior to said writing, driving a plurality of bitlines each connected to a respective column of auxiliary cells forming part of an auxiliary memory unit, so as to set each of the auxiliary cells to a first logic state, each of the auxiliary cells corresponding to a respective set of Z main cells, the auxiliary cells of the auxiliary memory unit being arranged into N2 rows and M2 columns, N2 being less than N1 and M2 being greater than M1/Z;
- selecting a particular row of auxiliary cells that includes at least one auxiliary cell whose corresponding set of main cells includes at least one of the selected cells;
- driving the bitlines so as to set the at least one auxiliary cell to a second logic state different from the first logic state.

47. A semiconductor device, comprising:
- a plurality of single-ported memory cells;
- a plurality of dual-ported memory cells arranged into rows and columns, each of the dual-ported memory cells corresponding to a respective set of single-ported memory cells;
- first wordlines and second wordlines connected to the rows of the dual-ported memory cells such that each row of the dual-ported memory cells is connected to a corresponding one of the first wordlines and a corresponding one of the second wordlines;
- first biltines and second biltines connected to the columns of the dual-ported memory cells such that each column of the dual-ported memory cells is connected to a corresponding set of the first bitlines and a corresponding set of the second bitlines;
- row decoder circuitry for jointly selecting at least one of the first wordlines and at least one of the second wordlines;
- bitline control circuitry for driving the first bitlines to enable writing of dual-ported memory cells connected to a first wordline that has been selected and for driving the second bitlines to enable writing of dual-ported memory cells connected to a second wordline that has been selected;
- control logic circuitry for (i) controlling the bitline control circuitry so as to set each of the dual-ported memory cells to a first logic state; (ii) causing input data to be written to selected ones of the single-ported memory cells and (iii) controlling the bitline control circuitry so as to set those dual-ported memory cells corresponding to the selected ones of the single-ported memory cells to a second logic state different from the first logic state.

* * * * *